United States Patent
Arai

(10) Patent No.: US 6,631,505 B2
(45) Date of Patent: Oct. 7, 2003

(54) SIMULATION CIRCUIT FOR MOS TRANSISTOR, SIMULATION TESTING METHOD, NETLIST OF SIMULATION CIRCUIT AND STORAGE MEDIUM STORING SAME

(75) Inventor: Takao Arai, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 78 days.

(21) Appl. No.: 09/996,251

(22) Filed: Nov. 28, 2001

(65) Prior Publication Data

US 2002/0063252 A1 May 30, 2002

(30) Foreign Application Priority Data

Nov. 29, 2000 (JP) .......................................... 2000-363909

(51) Int. Cl.[7] .............................................. G06F 17/50
(52) U.S. Cl. ........................................... 716/4; 327/198
(58) Field of Search .............................. 327/198; 716/1, 716/4, 11, 12

(56) References Cited

U.S. PATENT DOCUMENTS 6,211,710 B1 * 4/2001 Madhu et al. .............. 327/198

* cited by examiner

Primary Examiner—Leigh M. Garbowski
Assistant Examiner—Thuan Do
(74) Attorney, Agent, or Firm—Scully, Scott, Murphy & Presser

(57) ABSTRACT

A simulation circuit for MOS transistors is provided in which neither oscillation nor a change in a characteristic of feedback capacitance occurs. A ratio of a junction capacitance characteristic of a third diode and an electrostatic capacity characteristic of a capacitor to be displayed, changes in response to a change in a voltage between a drain and a gate and the junction capacitance characteristic of the third diode and the electrostatic capacity characteristic of the capacitor are displayed at an equal ratio in a region where a voltage between the drain and gate is almost 0 (zero) V and, therefore, normal simulation testing can be done and no oscillation occurs. Moreover, since no resistor component is connected in series in the third diode and the capacitor, there is no time constant. Therefore, a characteristic curve of the feedback capacitance can be normally obtained irrespective of the change rate of the voltage between the drain and gate.

12 Claims, 14 Drawing Sheets

FIG.2

```
SUBCKT NP88N04CHE_NEW 1 2 3
******************************
*     Model Generated by NEC       *
*        ALL Rights Reserved       *
*Commercial Use or Resale Restricted *
******************************
* Model generated on November 16, 2000
* MODEL FORMAT: SPICE3
* POWER MOSFET Model (Version 2.0)
* External Node Designations
* Node 1 -> Drain
* Node 2 -> Gate
* Node 3 -> Source
******************************
M1    4  5  3  3  NMOS  W=14.242 L=0.7u
DDS   3  1     DDS
CGS   5  3     1.22674E-9
RG    2  5     2.7
RD    1  4     RTEMP 0.835E-3
FDG   1  5     VFGD 1
EVGD  7  0  1  5  1
DDG1  8  7     DD1
DDG2  8  0     DD1
EGD1  9  0  7  8  1
EGD2  10 0  8  0  1
COX   10 11    3.29076E-9
DCRR  11 9     DDG
VFGD  11 0     0
******************************************************
.MODEL  NMOS        NMOS   (LEVEL  = 3            TOX    = 670E-10
+ XJ       = 0.4E-6         LD     = 0            WD     = 0
+ TPG      = 1              RS     = 0.3E-3       RD     = 1.2E-3
+ RG       = 0              NSUB   = 23.8E16      IS     = 0
+ UO       = 600            VMAX   = 5E4          KAPPA  = 0.3
+ NFS      = 0.65E12        NSS    = 1E5          THETA  = 1.5
+ ETA      = 1E-4           DELTA  = 0
+ KP       = 1E-4
+ CGSO     = 0              CGDO   = 0            CGBO   = 0
+ XQC      = 1.0            AF     = 1            CBD    = 0
+ CBS      = 0              CJ     = 0            CJSW   = 0
+ FC       = 0.5            JS     = 0            KF     = 0
+ MJ       = 0.5            MJSW   = 0.33         PB     = 0.8
+ RSH      = 0)
******************************************************
.MODEL DDS  S (CJO=5.01274E-9 VJ=0.8471 M=0.5456
+RS=0.001903 IS=1.0E-10 TT=20E-9 N=1.0952 BV=51)
******************************************************
.MODEL DDG  D (CJO=2.9313E-9 VJ=0.5738 M=0.4305 IS=1E-32 N=50 FC=1E-8)
******************************************************
.MODEL DD1  D (CJO=0 N=1)
******************************************************
.MODEL RTEMP RES (TC1=0.01168 TC2=1.3696E-5)
******************************************************
.ENDS NP88N04CHE_NEW
```

*FIG.6*

```
SUBCKT NP88N04CHE_HOSEI 1 2 3
**************************************
*       Model Generated by NEC       *
*          ALL Rights Reserved       *
*Commercial Use or Resale Restricted *
**************************************
* Model generated on November 27, 2000
* MODEL FORMAT: SPICE3
* POWER MOSFET Model (Version 2.0)
* External Node Designations
* Node 1 -> Drain
* Node 2 -> Gate
* Node 3 -> Source
**************************************
M1    4  5  3  3  NMOS  W=14.242  L=0.7u
DDS   3  1       DDS
CGS   5  3       1.22674E-9
RG    2  5       2.7
RD    1  4       RTEMP 0.835E-3
FDG   1  5       VFGD 1
EVGD  7  0  1  5  1
DDG1  8  7       DD1
DDG2  8  0       DD1
EGD1  9  0  7  8  1
EGD2  10 0  8  0  1
COX   10 11      3.29076E-9
DCRR  11 9       DDG
C1    11 9       3.77868E-10
VFGD  11 0       0
*****************************************************************
.MODEL NMOS     NMOS    (LEVEL = 3              TOX    = 670E-10
+ XJ     = 0.4E-6       LD     = 0              WD     = 0
+ TPG    = 1            RS     = 0.3E-3         RD     = 1.2E-3
+ RG     = 0            NSUB   = 23.8E16        IS     = 0
+ UO     = 600          VMAX   = 5E4            KAPPA  = 0.3
+ NFS    = 0.65E12      NSS    = 1E5            THETA  = 1.5
+ ETA    = 1E-4         DELTA  = 0
+ KP     = 1E-4
+ CGSO   = 0            CGDO   = 0              CGBO   = 0
+ XQC    = 1.0          AF     = 1              CBD    = 0
+ CBS    = 0            CJ     = 0              CJSW   = 0
+ FC     = 0.5          JS     = 0              KF     = 0
+ MJ     = 0.5          MJSW   = 0.33           PB     = 0.8
+ RSH    = 0)
*****************************************************************
.MODEL DDS S (CJO=5.01274E-9 VJ=0.8471 M=0.5456
+RS=0.001903 IS=1.0E-10 TT=20E-9 N=1.0952 BV=51)
*****************************************************************
.MODEL DDG D (CJO=2.5301E-9 VJ=1.0477 M=0.7550 IS=1E-32 N=50 FC=1E-8)
*****************************************************************
.MODEL DD1 D (CJO=0 N=1)
*****************************************************************
.MODEL RTEMP RES (TC1=0.01168 TC2=1.3696E-5)
*****************************************************************
.ENDS NP88N04CHE_HOSEI
```

FIG.8

```
SUBCKT  2SJ603 1 2 3
*****************************************
*       Model Generated by NEC          *
*          ALL Rights Reserved          *
*Commercial Use or Resale Restricted    *
*****************************************
* Model generated on November 27, 2000
* MODEL FORMAT: SPICE3
* POWER MOSFET Model (Version 2.0)
* External Node Designations
* Node 1 -> Drain
* Node 2 -> Gate
* Node 3 -> Source
******************************************
M1    4 5 3 3  NMOS  W=3.1185256 L=0.6u
DDS   1 3      DDS
CGS   5 3      2.965E-10
RG    2 5      11
RD    1 4      RTEMP 5.106008E-3
FDG   1 5      VFGD 1
EVGD  7 0 1 5 1
DDG1  8 0      DD1
DDG2  8 7      DD1
EGD1  9 0 8 0 1
EGD2  10 0 7 8 1
COX   10 11    8.43189E-10
DCRR  9 11     DDG
VFGD  11 0     0
***************************************************************
.MODEL  NMOS       NMOS  (LEVEL   = 3                    TOX   = 440E-10
+ XJ        = 1.17E-6          LD      = 0               WD    = 0
+ TPG       = 1                RS      = 1.2E-3          RD    = 27.8E-3
+ RG        = 0                NSUB    = 2.35E17         IS    = 0
+ UO        = 0                KAPPA   = 0.7
+ NFS       = 0.50E12
+ KP        = 9.2E-6           PHI     =0.88
+ CGSO      = 0                CGDO    = 0               CGBO  = 0
+ XQC       = 1.0              AF      = 1               CBD   = 0
+ CBS       = 0                CJ      = 0               CJSW  = 0
+ FC        = 0.5              JS      = 0               KF    = 0
+ MJ        = 0.5              MJSW    = 0.33            PB    = 0.8
+ RSH       = 0)
***************************************************************
.MODEL DDS D (CJO=1.02341E-9 VJ=0.499620057 M=0.521168511
+RS=0.007033078 IS=1.00E-10 TT=21.7E-9 N=1.202620657 BV=70)
***************************************************************
.MODEL DDG D (CJO=4.725E-10 VJ=0.43 M=0.388671743 IS=1E-32 N=50 FC=1E-8)
***************************************************************
.MODEL DD1 D (CJO=0 N=1)
***************************************************************
.MODEL RTEMP RES (TC1=0.041017818 TC2=5.55774E-5)
***************************************************************
.ENDS 2SJ603
```

US 6,631,505 B2

SIMULATION CIRCUIT FOR MOS TRANSISTOR, SIMULATION TESTING METHOD, NETLIST OF SIMULATION CIRCUIT AND STORAGE MEDIUM STORING SAME

BACKGROUND OF THE INVENTION

1. Field of the Invention

The present invention relates to a simulation circuit for a MOS (Metal Oxide Semiconductor) transistor used for simulation testing, for example, the simulation circuit for the MOS transistor (that is, a transistor model) which can be suitably used for the simulation testing using a simulator such as a SPICE (Simulation Program with Integrated Circuit Emphasis) or a like and to a method for the simulation testing of the MOS transistor, a storage medium storing a netlist (that is, data information required to implement the transistor model on a computer) of the simulation circuit for the MOS transistor and the netlist of the simulation circuit for the MOS transistor.

The present application claims priority of Japanese Patent Application No. 2000-363909 filed on Nov. 29, 2000, which is hereby incorporated by reference.

2. Description of the Related Art

Information about characteristics of a semiconductor (for example, a MOS transistor) is conventionally stated in a data book, product catalog, or a like and is provided to customers. In recent years, however, there are increasing cases in which the information about the characteristics of semiconductors and/or a netlist showing configurations of an equivalent circuit inside the MOS transistor are distributed via communication lines such as the Internet. Therefore, the customers, after having obtained information about the characteristics of semiconductors in outline from the data book or from homepages of the Internet and having in advance selected the MOS transistor being a candidate to be employed, acquire the netlist showing a simulation circuit of the selected MOS transistor via the Internet or a like and then do detailed simulation testing of an application circuit (that is, a user circuit), using the SPICE or a like, based on the simulation circuit for the MOS transistor whose information has been already acquired. Then, the customers determine the MOS transistor to be employed based on a result of the simulation testing.

Such the kind of simulation circuit for MOS transistors is disclosed by, for example, Siliconics Inc., which has a gate terminal Gas shown in FIG. 9. As shown in FIG. 9, the gate terminal G is connected to a node N1 to which a gate electrode of an n-channel type MOSFET (hereinafter referred to as an "NMOS") 1 is connected. A source terminal S is connected to a node N2 to which a source electrode and a bulk electrode of the NMOS 1 are connected. Between the node N1 and node N2 is connected a gate/source capacitor 2 (the capacitor being connected between the gate and source). To the node N2 is connected an anode of a drain/source diode 3 (the diode being connected between the drain and source) and to a node N4 is connected a cathode of the drain/source diode 3. A drain terminal D is connected to the node N4. The node N4 is connected to a node N3 through a drain resistor 4. To the node N3 is connected a drain electrode of the NMOS 1. To the node N4 is connected a bulk electrode of a p-channel type MOSFET (hereinafter referred to a "PMOS") 5. A gate electrode of the PMOS 5 is connected to the node N1. Both a drain electrode and source electrode of the PMOS 5 are connected to the node N2 so that a parasitic diode of the PMOS 5 does not operate.

In the simulation circuit of the MOS transistor, a capacitor made up of the PMOS 5 serves as a feedback capacitor formed between the gate electrode and the drain electrode of the NMOS 1. The simulation circuit is used for the simulation testing using the SPICE.

FIGS. 10 and 11 are diagrams showing results of the simulation testing done using the conventional simulation circuit for MOS transistors of FIG. 9. A feedback capacitance Crss is plotted as the ordinate and a voltage between the drain and gate VDG (hereinafter a "drain-gate voltage VDG") as the abscissa. In FIG. 10, a result is shown which has been obtained by calculating a value of the feedback capacitance Crss based on a current flowing through the feedback capacitor when the drain-gate voltage VDG is changed from 40 V to −10 V at a rate of 1 V/$\mu$s. In FIG. 11, a result is shown which has been obtained by calculating a value of the feedback capacitance Crss based on a current flowing through the feedback capacitor when the drain-gate voltage VDG is changed from 40 V to −10 V at a rate of 1 V/ns.

FIG. 12 is a circuit diagram showing electrical configurations of another conventional simulation circuit for MOS transistors disclosed by IR Inc. The disclosed simulation circuit for MOS transistors, as shown in FIG. 12, has a gate terminal G which is connected to a node N2. Between the node N2 and a node N7 is connected a resistor 11 and to the node N7 is connected a gate electrode of an NMOS 12. A source electrode and a bulk electrode of the NMOS 12 are connected to a node N8 which is connected to a node N3 through a resistor 13. To the node N3 is connected a source terminal S. To the node N3 is connected an anode of a diode 14. A cathode of the diode 14 is connected to a node N1. Between the node N3 and node N1 is connected a resistor 15. To the node N1 is connected a drain terminal D. The node N1 is connected to a node N9 through a resistor 16 and to the node N9 is connected a drain electrode of the NMOS 12.

To the node N7 is connected a minus input terminal of a voltage-controlled type voltage source 17. To the node N9 is connected a plus output terminal of the voltage-controlled type voltage source 17. The plus output terminal of the voltage-controlled type voltage source 17 is connected to a node N10 and between the node N10 and a node N5 is connected a resistor 18. To the node N5 is connected a cathode of a diode 19 and an anode of the diode 19 is connected to a node N0. The node N0 is connected to a port of a ground and to the minus output terminal of the voltage-controlled type voltage source 17. Between the node N10 and a node N11 is connected a capacitor 20. Between the node N10 and a node N6 is connected a resistor 21. To the node N5 is connected a cathode of a diode 22 and an anode of the diode 22 is connected to a node N4. To the node N6 is connected a cathode of a diode 23 and an anode of the diode 23 is connected to the node N0.

To the node N11 is connected an anode on an input side of a current-controlled type current source 24 and to the node N6 is connected a cathode on an input side of the current-controlled type current source 24. An anode on an output side of the current-controlled type current source 24 is connected to the node N9 and a cathode on an output side of the current-controlled type current source 24 is connected to the node N7. To the node N4 is connected an anode on an input side of a current-controlled type current source 25 and to the node N0 is connected a cathode on an input side of the current-controlled type current source 24. An anode on an output side of the current-controlled type current source 25 is connected to the node N9 and a cathode on an output side of the current-controlled type current source 25 is connected to the node N7.

The voltage-controlled type voltage source 17 receives an input of a drain-gate voltage VDG being a voltage between a gate electrode and a drain electrode of the NMOS 12 and outputs an output voltage V17 having the same value as the drain-gate voltage VDG. In the resistor 18, when there is no current flow through the diode 19 (that is, when the drain-gate voltage VDG>−VF, where VF is a forward voltage of the diode 19), almost no voltage drop occurs. Therefore, almost all the output voltages V17 are applied to the diodes 19 and 22. At this point, a current produced by junction capacitance of the diode 22 flows through the diode 22. Moreover, when the drain-gate voltage VDG<−VF, where VF is the forward voltage VF of the diode 19, a current flows through the diode 19 and a voltage across the resistor 21 increases, and both a voltage across the diode 19 and a voltage across the diode 22 are fixed by the forward voltage VF of the diodes 19 and 22. As a result, even if the drain-gate voltage VDG changes, both the voltage across the diode 19 and the voltage across the diode 22 remain unchanged and no current produced by the junction capacitance of the diode 22 flows. At this point, since the forward voltage VF of the diode 22 is set so as to be much greater than the forward voltage VF of the diode 19, almost no forward current flows through the diode 22.

The diode 19, when the drain-gate voltage VDG<−VF, where VF is the forward voltage of the diode 19, fixes the voltage across the diode 22. The forward voltage VF of the diode 19 is set so as to be equal to a forward voltage VF of the diode 23. Capacitance of the capacitor 20 is displayed as electrostatic capacity when the drain-gate voltage VDG is negative. The resistor 21, when no current flows through the diode 23, that is, when the drain-gate voltage VDG>−VF, where VF is a forward voltage of the diode 23, causes the capacitor 20 to be discharged. That is, when the drain-gate voltage VDG>−VF, where VF is the forward voltage VF of the diode 23, almost all the output voltages V17 from the voltage-controlled type voltage source 17 are applied to the diode 23 and almost no voltage is applied to the resistor 21 and capacitor 20. Therefore, even if the drain-gate voltage VDG changes, the voltage across the capacitor 20 remains unchanged and, as a result, no current flows through the capacitor 20. Moreover, when the drain-gate voltage VDG<−VF, where is VF is the forward voltage of the diode 23, a current flows through the diode 23 and a voltage across the resistor 21 increases and a voltage is applied to the capacitor 20 causing the current to flow through the capacitor 20.

The junction capacitance of the diode 22 is displayed when the drain-gate voltage VDG is positive. The diode 23, when the drain-gate voltage VDG<−VF, where VF is the forward voltage VF of the diode 23, applies a voltage to the capacitor 20. The current-controlled type current source 24 causes the current flowing through the capacitor 20 to flow between the drain and gate of the NMOS 12. The current-controlled type current source 25 causes the current flowing through the diode 22 having the junction capacitance to flow between the drain and gate of the NMOS 12.

In the conventional simulation circuit of the MOS transistor, when the drain-gate voltage VDG>−VF, where VF is the forward voltage of the diodes 19 and 23, no forward current flows through the diodes 19 and 23 and a junction capacitance characteristic of the diode 22 is displayed as feedback capacitance. Moreover, when the drain-gate voltage VDG<−VF, where VF is the forward voltage of the diodes 19 and 23, no forward current flows through the diodes 19 and 23 and an electrostatic capacity characteristic of the capacitor 20 is displayed as the feedback capacitance.

FIGS. 13 and 14 are diagrams showing results from the simulation testing done using the conventional simulation circuit for MOS transistors of FIG. 12. In FIG. 13, the result is shown which has been obtained by calculating values of feedback capacitance Crss based on a current flowing through a feedback capacitor when the drain-gate voltage VDG is changed from 40 V to −10 V at a rate of 1 V/μs. In FIG. 14, the result is shown which has been obtained by calculating values of feedback capacitance Crss based on a current flowing through a feedback capacitor when the drain-gate voltage VDG is changed from 40 V to −10 V at a rate of 1 V/ns.

However, the conventional simulation circuits for MOS transistors have following problems.

That is, in the conventional simulation circuit of MOS transistors shown in FIG. 9, there is a turning point (that is, a point where the simulation testing is not done normally) of a characteristic of the feedback capacitance Crss at a place where the drain-gate voltage VDG is close to 0 V and oscillation of electrostatic capacity in the PMOS 5 is apt to occur at a place where the drain-gate voltage VDG is close to 40 V and, therefore, as shown in FIG. 10, oscillation (or divergence) occurs in a characteristic curve showing the feedback capacitance Crss at a place where the drain-gate voltage VDG is close to 0 V and to 40 V. Moreover, in FIG. 11, as in the case shown in FIG. 10, there is the same problem in that the oscillation occurs in the characteristic curve of the feedback capacitance Crss. Therefore, if the simulation testing of application circuits (user circuits) is done by using such the transistor model in which the oscillation occurs, correct prediction of operations of the application circuit is impossible and, due to divergence of the result from the simulation testing, complete simulation testing of operations of circuits is made impossible.

Moreover, in the conventional simulation circuit for MOS transistors shown in FIG. 12, since the resistance components (such as the resistor 18 or the diode 23) are connected in series to the diode 22 or capacitor 20 making up the feedback capacitor, time constant is included, which causes a capacity characteristic to be changed by the change rate in the drain-gate voltage VDG. Therefore, as shown in FIG. 13, when the drain-gate voltage VDG is changed at the rate of 1 V/μs, the characteristic of the feedback capacitance Crss is normally calculated, however, as shown in FIG. 14, when the drain-gate voltage VDG is changed at the rate of 1 V/ns, there occurs missing of normal simulation testing at a place where the drain-gate voltage VDG is close to 0 V to −2 V in some cases and an abnormal peak occurs in the characteristic curve of the feedback capacitance Crss.

SUMMARY OF THE INVENTION

In view of the above, it is an object of the present invention to provide a simulation circuit for a MOS transistor and a method for simulation testing of the MOS transistor using the simulation circuit which are capable of normally obtaining a characteristic curve of feedback capacitance irrespective of a change rate of a voltage between a drain and gate and to a storage medium storing a netlist of the simulation circuit for the MOS transistor and to the netlist of the simulation circuit for the MOS transistor.

According to a first aspect of the present invention, there is provided a simulation circuit for a MOS transistor for doing simulation testing of the MOS transistor using a netlist showing internal configurations of the MOS transistor, the simulation circuit including:

a feedback capacitor formed between a gate electrode and a drain electrode of the MOS transistor; and wherein the feedback capacitor includes a diode having a predetermined junction capacitance characteristic and a diode having a predetermined electrostatic capacity characteristic and wherein the junction capacitance characteristic of the diode is chiefly displayed when an absolute value of a voltage of the drain electrode is larger than an absolute value of a voltage of the gate electrode and the electrostatic capacity characteristic of the capacitor is chiefly displayed when the absolute value of a voltage of the drain electrode is smaller than the absolute value of a voltage of the gate electrode and the junction capacitance characteristic of the diode and the electrostatic capacity characteristic of the capacitor are equally displayed when the absolute value of the voltage of the gate electrode is almost same as the absolute value of the voltage of the drain electrode.

According to a second aspect of the present invention, there is provided a simulation circuit for a MOS transistor for doing simulation testing of the MOS transistor using a netlist showing internal configurations of the MOS transistor, the simulation circuit including:

a feedback capacitor formed-between a gate electrode and a drain electrode of the MOS transistor; and wherein the feedback capacitor includes:

a first voltage-controlled type voltage source, whose terminals on an input side are insulated from terminals on an output side, receives an input of a drain-gate voltage VDG being a voltage between the gate electrode and the drain electrode and outputs a first output voltage having the same value as the drain-gate voltage VDG;

a bidirectional diode having a first diode and a second diode, both of which have no junction capacitance and are connected in series so that the first diode and the second diode are opposite in polarity, wherein the bidirectional diode receives an input of the first output voltage and, when the first output voltage is positive, outputs a second output voltage having almost the same value as the first output voltage from the first diode and, when the first output voltage is negative, outputs a third output voltage having almost the same value as the first output voltage from the second diode and, when the first output voltage is almost 0 (zero) volts, outputs the second output voltage and the third output voltage each being half the first output voltage from the first diode and the second diode respectively;

a second voltage-controlled type voltage source, whose terminals on an input side are insulated from terminals on an output side, receives an input of the second output voltage and outputs a fourth output voltage having the same value as the second output voltage;

a third voltage-controlled type power source, whose terminals on an input side are insulated from terminals on an output side, receives an input of the third output voltage and outputs a fifth output voltage having the same value as the third output voltage;

a third diode having a predetermined junction capacitance characteristic receives an input of the fourth output voltage and outputs a first output current corresponding to the fourth output voltage;

a capacitor having a predetermined electrostatic capacity characteristic receives an input of the fifth output voltage and outputs a second output current corresponding to the fifth output voltage; and a current-controlled type current source, whose terminals on an input side are insulated from terminals on an output side, receives inputs of the first output current and the second output current and causes a third current having the same value as the first output current and the second output current to flow between the gate electrode and the drain electrode.

According to a third aspect of the present invention, there is provided a simulation circuit for a MOS transistor for doing simulation testing of the MOS transistor using a netlist showing internal configurations of the MOS transistor, the simulation circuit including:

a feedback capacitor formed between a gate electrode and a drain electrode of the MOS transistor; and wherein the feedback capacitor includes:

a first voltage-controlled type voltage source, whose terminals on an input side are insulated from terminals on an output side, receives an input of a drain-gate voltage VDG being a voltage between the gate electrode and the drain electrode and outputs a first output voltage having the same value as the drain-gate voltage VDG;

a bidirectional diode having a first diode and a second diode, both of which have no junction capacitance and are connected in series so that the first diode and the second diode are opposite in polarity, wherein the bidirectional diode receives an input of the first output voltage and, when the first output voltage is positive, outputs a second output voltage having almost the same value as the first output voltage from the first diode and, when the first output voltage is negative, outputs a third output voltage having almost the same value as the first output voltage from the second diode and, when the first output voltage is almost 0 (zero) volts, outputs the second output voltage and the third output voltage each being half the first output voltage from the first diode and the second diode respectively;

a second voltage-controlled type voltage source, whose terminals on an input side are insulated from terminals on an output side, receives an input of the second output voltage and outputs a fourth output voltage having the same value as the second output voltage;

a third voltage-controlled type power source, whose terminals on an input side are insulated from terminals on an output side, receives an input of the third output voltage and outputs a fifth output voltage having the same value as the third output voltage;

a third diode having a predetermined junction capacitance characteristic receives an input of the fourth output voltage and outputs a first output current corresponding to the fourth output voltage;

a capacity characteristic correcting element being connected in parallel to the third diode and being used to correct the junction capacitance characteristic of the third diode so as to provide a desired junction capacitance characteristic;

a capacitor having a predetermined electrostatic capacity characteristic receives an input of the fifth output voltage and outputs a second output current corresponding to the fifth output voltage; and a current-controlled type current source, whose terminals on an input side are insulated from terminals on an output side, receives inputs of the first output current and the second output current and causes a third current having the same value as the first output current and the second output current to flow between the gate electrode and the drain electrode.

In the foregoing, a preferable mode is one wherein the capacity characteristic correcting element is made up of a capacitor having a predetermined electrostatic capacity characteristic or a diode having a predetermined junction capacitance characteristic.

According to a fourth aspect of the present invention, there is provided a method for simulation testing of a MOS transistor by using a simulation circuit of the MOS transistor described above.

According to a fifth aspect of the present invention, there is provided a method for simulation testing of a MOS transistor in which a feedback capacitor is formed between a gate electrode and a drain electrode by using a simulation circuit of the MOS transistor and by using a netlist showing configurations of the MOS transistor, the method including:

a step of configuring the feedback capacitor in the simulation circuit using a first voltage-controlled type voltage source, whose terminals on an input side are insulated from terminals on an output side, which receives an input of a drain-gate voltage VDG being a voltage between the gate electrode and the drain electrode and outputs a first output voltage having the same value as the drain-gate voltage VDG;

a step of configuring the feedback capacitor in the simulation circuit using a bidirectional diode having a first diode and a second diode, both of which have no junction capacitance and are connected in series so that the first diode and the second diode are opposite in polarity, wherein the bidirectional diode receives an input of the first output voltage and, when the first output voltage is positive, outputs a second output voltage having almost the same value as the first output voltage from the first diode and, when the first output voltage is negative, outputs a third output voltage having almost the same value as the first output voltage from the second diode and, when the first output voltage is almost 0 (zero) volts, outputs the second output voltage and the third output voltage each being half the first output voltage from the first diode and the second diode respectively;

a step of configuring the feedback capacitor in the simulation circuit using a second voltage-controlled type voltage source, whose terminals on an input side are insulated from terminals on an output side, which receives an input of the second output voltage and outputs a fourth output voltage having the same value as the second output voltage;

a step of configuring the feedback capacitor in the simulation circuit using a third voltage-controlled type power source, whose terminals on an input side are insulated from terminals on an output side, which receives an input of the third output voltage and outputs a fifth output voltage having the same value as the third output voltage;

a step of configuring the feedback capacitor in the simulation circuit using a third diode having a predetermined junction capacitance characteristic which receives an input of the fourth output voltage and outputs a first output current corresponding to the fourth output voltage;

a step of configuring the feedback capacitor in the simulation circuit using a capacitor having a predetermined electrostatic capacity characteristic which receives an input of the fifth output voltage and outputs a second output current corresponding to the fifth output voltage;

a step of configuring the feedback capacitor in the simulation circuit using a current-controlled type current source, whose terminals on an input side are insulated from terminals on an output side, which receives inputs of the first output current and the second output current and causes a third current having the same value as the first output current and the second output current to flow between the gate electrode and the drain electrode; and wherein a value of the feedback capacitor is calculated based on the third output current.

According to a sixth aspect of the present invention, there is provided a method for simulation testing of a MOS transistor in which a feedback capacitor is formed between a gate electrode and a drain electrode by using a simulation circuit of the MOS transistor and by using a netlist showing configurations of the MOS transistor, the method including:

a step of configuring the feedback capacitor in the simulation circuit using a first voltage-controlled type voltage source, whose terminals on an input side are insulated from terminals on an output side, which receives an input of a drain-gate voltage VDG being a voltage between the gate electrode and the drain electrode and outputs a first output voltage having the same value as the drain-gate voltage VDG;

a step of configuring the feedback capacitor in the simulation circuit using a bidirectional diode having a first diode and a second diode, both of which have no junction capacitance and are connected in series so that the first diode and the second diode are opposite in polarity, wherein the bidirectional diode receives an input of the first output voltage and, when the first output voltage is positive, outputs a second output voltage having almost the same value as the first output voltage from the first diode and, when the first output voltage is negative, outputs a third output voltage having almost the same value as the first output voltage from the second diode and, when the first output voltage is almost 0 (zero) volts, outputs the second output voltage and the third output voltage each being half the first output voltage from the first diode and the second diode respectively;

a step of configuring the feedback capacitor in the simulation circuit using a second voltage-controlled type voltage source, whose terminals on an input side are insulated from terminals on an output side, which receives an input of the second output voltage and outputs a fourth output voltage having the same value as the second output voltage;

a step of configuring the feedback capacitor in the simulation circuit using a third voltage-controlled type power source, whose terminals on an input side are insulated from terminals on an output side, which receives an input of the third output voltage and outputs a fifth output voltage having the same value as the third output voltage;

a step of configuring the feedback capacitor in the simulation circuit using a third diode having a predetermined junction capacitance characteristic which receives an input of the fourth output voltage and outputs a first output current corresponding to the fourth output voltage;

a step of configuring the feedback capacitor in the simulation circuit using a capacity characteristic correcting element which is connected in parallel to the third diode and is used to correct the junction capacitance characteristic of the third diode so as to provide a desired junction capacitance characteristic;

a step of configuring the feedback capacitor in the simulation circuit using a capacitor having a predetermined electrostatic capacity characteristic which receives an input of the fifth output voltage and outputs a second output current corresponding to the fifth output voltage; and a step of configuring the feedback capacitor in the simulation circuit using a current-controlled type current source, whose terminals on an input side are insulated from terminals on an output side, which receives inputs of the first output current and the second output current and causes a third current having the same value as the first output current and the second output current to flow between the gate electrode and the drain electrode; and wherein a value of the feedback capacitor is calculated based on the third output current.

According to a seventh aspect of the present invention, there is provided a storage medium storing a netlist to implement a simulation circuit of MOS transistors described above on a computer.

According to an eighth aspect of the present invention, there is provided a storage medium storing a netlist to implement a simulation circuit of MOS transistors described above on a computer.

According to a ninth aspect of the present invention, there is provided a netlist to implement a simulation circuit of MOS transistors described above on a computer.

According to a tenth aspect of the present invention, there is provided a netlist to have a computer perform a method for simulation testing of MOS transistors described above.

With the above configurations, a ratio at which a junction capacitance characteristic of a third diode and a electrostatic capacity characteristic of a capacitor are displayed changes in response to change in a voltage between a drain electrode and a gate electrode and the junction capacitance characteristic of the third diode and the electrostatic capacity characteristic of the capacitor are displayed at an equal ratio in a region where the voltage between the drain electrode and gate electrode is almost 0 V and, therefore, normal simulation testing can be done and no oscillation occurs. Moreover, since no resistor component is connected in series in the third diode and the capacitor, there is no time constant. Therefore, a characteristic curve of feedback capacitance can be normally obtained irrespective of a change rate of the voltage between the drain electrode and gate electrode. Furthermore, even when the normal characteristic curve cannot be obtained only by the junction capacitance of the third diode, correction is made to the junction capacitance characteristic and, therefore, the normal characteristic curve of the feedback capacitance can be obtained. As a result, when the simulation testing of a user circuit using a simulation circuit of MOS transistors of the present invention is done, a circuit implemented on a computer completely matches an actual circuit and a result from the simulation testing displayed on the computer can be used in a same manner that a screen of an oscilloscope is used.

BRIEF DESCRIPTION OF THE DRAWINGS

The above and other objects, advantages, and features of the present invention will be more apparent from the following description taken in conjunction with the accompanying drawings in which:

FIG. 2 is a diagram showing an example of a netlist of the simulation circuit for MOS transistors of FIG. 1;

FIG. 6 is a diagram showing an example of a netlist of the simulation circuit for MOS transistors of FIG. 5;

FIG. 8 is a diagram showing an example of a netlist of the simulation circuit for MOS transistors of FIG. 7;

DETAILED DESCRIPTION OF THE PREFERRED EMBODIMENTS

Best modes of carrying out the present invention will be described in further detail using various embodiments with reference to the accompanying drawings.

First Embodiment

Figure 1:
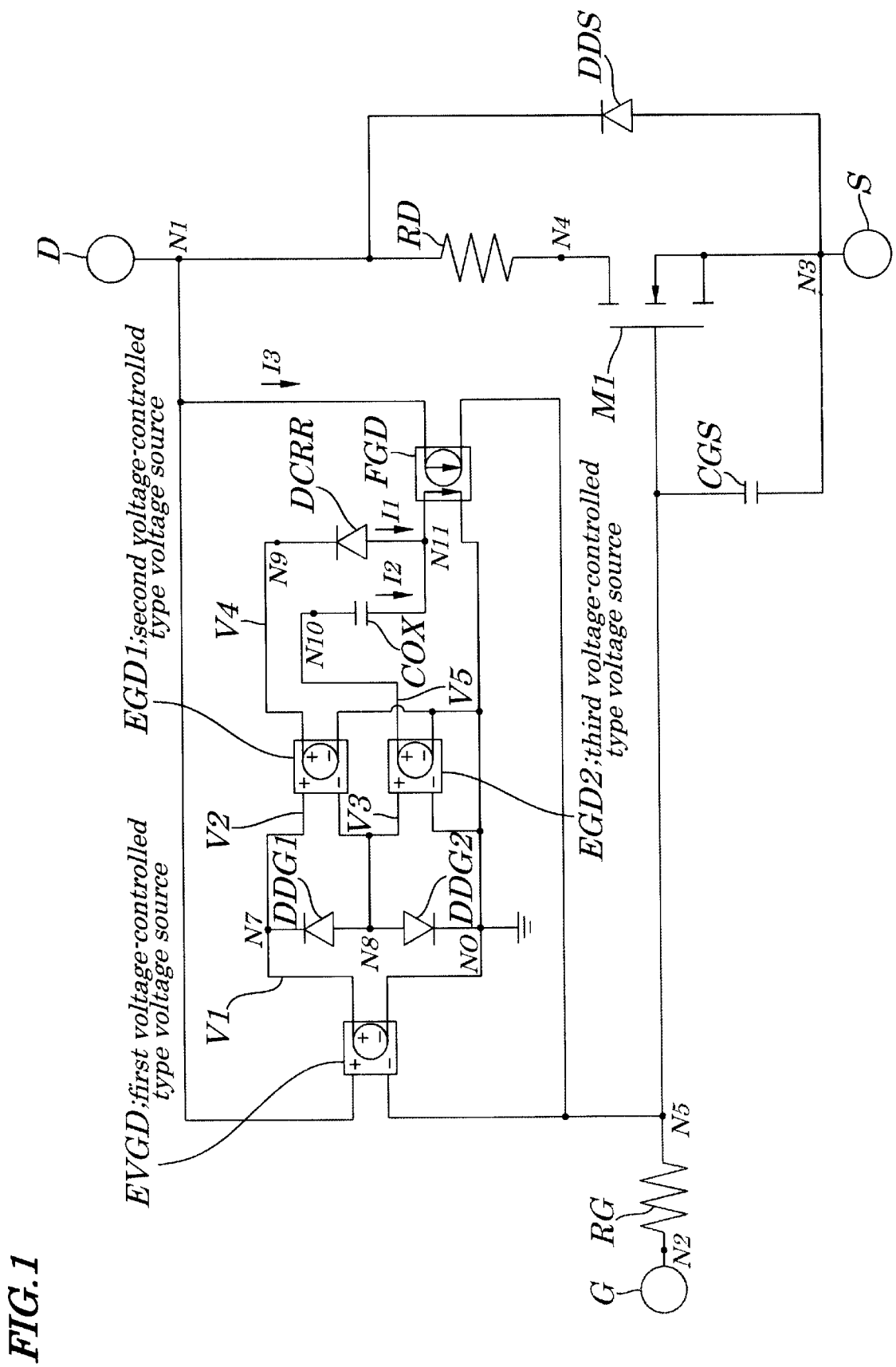
FIG. 1 is a circuit diagram showing electrical configurations of a simulation circuit for MOS transistors according to a first embodiment of the present invention.

FIG. 1 is a circuit diagram showing electrical configurations of a simulation circuit for MOS transistors according to a first embodiment of the present invention.

The simulation circuit for MOS transistors of the first embodiment is used to do simulation testing of the MOS transistor having a feedback capacitor formed between a gate electrode and a drain electrode of the MOS transistor by inputting a netlist showing internal configurations of the MOS transistor into a simulator such as SPICE. In the simulation circuit for MOS transistors, as shown in FIG. 1, its gate terminal G is connected to a node N2. Between the node N2 and a node N5 is connected a resistor RG. To the node N5 is connected a gate electrode of an enhancement-type NMOS M1. A source electrode and bulk electrode of the NMOS M1 are connected to a node N3 to which a source terminal S is connected. Between the node N5 and the node N3 is connected a capacitor between a gate and source CGS (hereinafter a gate/source capacitor CGS). To the node N3 is connected an anode of a diode DDS and a cathode of the diode DDS is connected to a node N1. To the node N1 is connected a drain terminal D. The node N1 is connected to a node N4 through a resistor RD and to the node N4 is connected a drain electrode of the NMOS M1.

Moreover, to the node N5 is connected a minus input terminal of a first voltage-controlled type voltage source EVGD. To the node N1 is connected a plus input terminal of the first voltage-controlled type voltage source EVGD. A plus output terminal of the first voltage-controlled type voltage source EVGD is connected to a node N7. To the node N7 is connected a cathode of a first diode DDG 1 and to a node N8 is connected an anode of the first diode DDG 1. To the node N8 is connected an anode of a second diode DDG 2 and a node N0 is connected to a cathode of the second diode DDG 2. The node N0 is connected to a port of a ground and to a minus output terminal of the first voltage-controlled type voltage source EVGD. To the node N7 is connected a plus input terminal of a second voltage-controlled type voltage source EGD 1. To the node N8 is connected a minus input terminal of the second voltage-controlled type voltage source EGD 1. To the node N8 is connected a plus input terminal of the third voltage-controlled type voltage source EGD 2 and to the node N0 is connected a minus input terminal of the third voltage-controlled type voltage source EGD 2. A plus output terminal of the second voltage-controlled type voltage source EGD 1 is connected to a node N9 to which a cathode of a third diode DCRR is connected. An anode of the third diode DCRR is connected to a node N11. To the node N11 is connected an anode on an input side of a current-controlled type current source FGD and a cathode on an input side of the current-controlled type current source FGD is connected to the node N0. A minus output terminal of the second voltage-controlled type voltage source EGD 1 is connected to the node N0. A plus output terminal of the third voltage-controlled type voltage source EGD 2 is connected to a node N10. Between the node N10 and the node N11 is connected a capacitor COX. A minus output terminal of the third voltage-controlled type voltage source EGD 2 is connected to the node N0. An anode on an output side of the current-controlled type current source FGD is connected to the node N1 and a cathode on the output side of the current-controlled type current source FGD is connected to the node N5. The first voltage-controlled type voltage source EVGD, first diode DDG 1 and second diode DDG 2, second voltage-controlled type voltage source EGD 1 and third voltage-controlled type voltage source EGD 2, third diode DCRR, capacitor COX, and current-controlled type current source FGD make up a feedback capacitor.

The first voltage-controlled type voltage source EVGD, whose terminals on an input side are insulated from those on an output side, receives an input of the drain-gate voltage VDG (not shown in FIG. 1) being the voltage between the gate terminal G and the drain terminal D and outputs a first output voltage V1 having the same value as the drain-gate voltage VDG. The first diode DDG 1 and the second diode DDG 2 have no junction capacitance and are connected in series in a manner so as to be opposite to each other in polarity. The first diode DDG 1 receives an input of the first output voltage V1 and, when the first output voltage V1 is positive, outputs a second output voltage V2 being almost the same as the first output voltage V1. The second diode DDG 2 receives an input of the first output voltage V1 and, when the first output voltage V1 is negative, outputs a third output voltage V3 being almost the same as the first output voltage V1. The first diode DDG 1 outputs, when the first output voltage V1 is almost 0 V, the second output voltage V2 being half the first output voltage V1 and the second diode DDG 2 outputs, when the first output voltage V1 is almost 0 V, the third output voltage V3 being half the first output voltage V1. These two diodes, the first diode DDG 1 and the second diode DDG 2 make up a bidirectional diode.

The second voltage-controlled type voltage source EGD 1, whose terminals on an input side are insulated from those on an output side, receives an input of the second output voltage V2 and outputs a fourth output voltage V4 having the same value as the second output voltage V2.

The third voltage-controlled type voltage source EGD2, whose terminals on an input side are insulated from those on an output side, receives an input of the third output voltage V3 and outputs a fifth output voltage V5 having the same value as the third output voltage V3. The third diode DCRR has a predetermined junction capacity characteristic and receives an input of the fourth output voltage V4 and outputs a first output current I1 that corresponds to the fourth output voltage V4. The capacitor COX has a predetermined electrostatic capacity characteristic and receives an input of the fifth output voltage V5 and outputs a second output current I2 that corresponds to the fifth output voltage V5. The current-controlled type current source FGD, whose terminals on an input side are insulated from those on an output side, receives an input of the first output current I1 and I2 and the second output current causes a third output current I3 being the same value as the first output current I1 and the second output current I2 to flow between the gate terminal G and the drain terminal D. A feedback capacitance Crss is calculated by the following equation:

$$Crss=I3/(dv/dt)$$

where dv denotes an amount of changes in the drain-gate voltage VDG.

FIG. 2 is a diagram showing an example of a netlist of the simulation circuit for MOS transistors of FIG. 1. The netlist is stored in, for example, a storage medium such as a CD-ROM, floppy-disk, or a like and is then provided to customers and/or is distributed via the Internet. The customers acquire the netlist and do detailed simulation testing of the simulation circuit for MOS transistors, based on the acquired netlist, by using the simulator such as SPICE.

Figure 3:
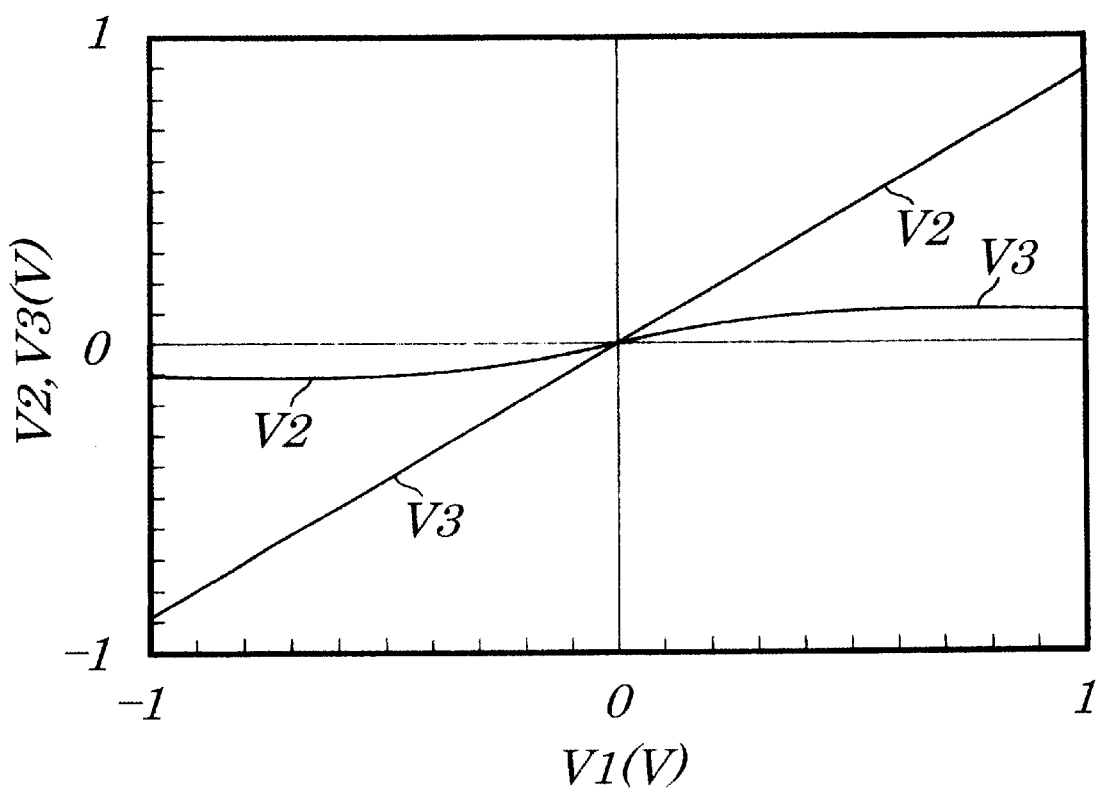
FIG. 3 is a diagram explaining behavior of first diode DDG 1 and second diode DDG 2 employed in the simulation circuit of FIG. 1.

FIG. 3 is a diagram explaining behavior of first diode DDG 1 and second diode DDG 2 employed in the simulation circuit of FIG. 1. The second output voltage V2 and the third output voltage V3 are plotted as the ordinate and the first output voltage V1 as the abscissa. As shown in FIG. 3, in a region where the first output voltage V1 is positive, the second output voltage V2 is proportional to the first output voltage V1 and the third output voltage V3 becomes 0 V to about 0.2 V (that is, a forward voltage of the second diode DDG 2). In a region where the first output voltage V1 is negative, the second output voltage V2 becomes −0 to about −0.2 V (that is, a forward voltage of the first diode DDG 1) and the third output voltage V3 is approximately proportional to the first output voltage V1.

Figure 4:
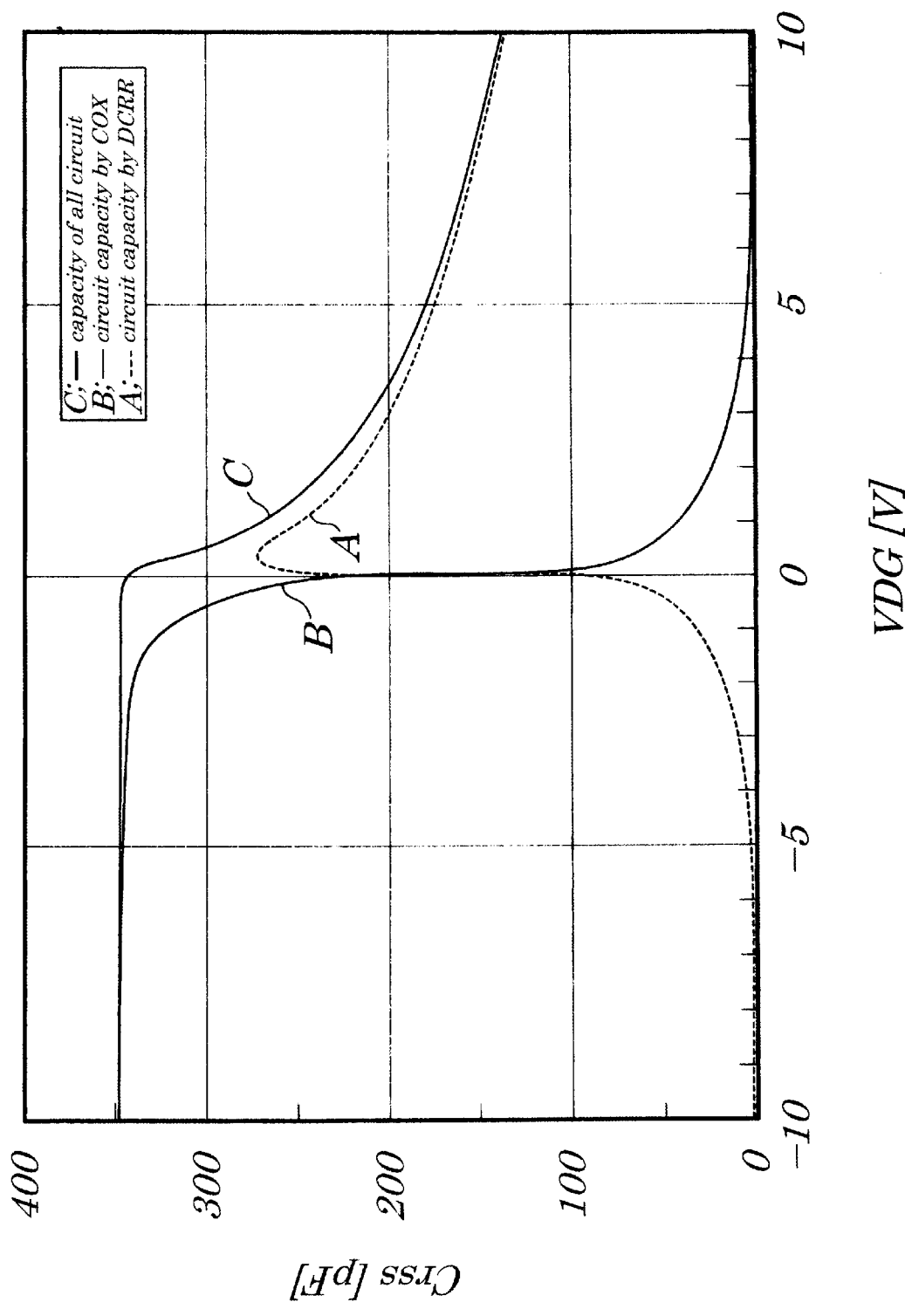
FIG. 4 is a diagram showing a result from simulation testing of the simulation circuit for MOS transistors of FIG. 1.

FIG. 4 is a diagram showing a result from the simulation testing of the simulation circuit for MOS transistors of FIG. 1. The feedback capacitance Crss is plotted as the ordinate and the drain-gate voltage VDG as the abscissa.

In FIG. 4, a characteristic curve C is shown which is a result of calculations of values based on a current flowing through the feedback capacitor when the drain-gate voltage VDG is changed from 10 V to −10 V at the rate of 1 V/μs. The normal characteristic curve C is a curve obtained by combining a characteristic curve A showing a characteristic of junction capacitance of the third diode DCRR and a characteristic curve B showing a characteristic of electrostatic capacitance of the capacitor COX. That is, as shown in the normal characteristic curve C showing the feedback capacitance, in a region where the drain-gate voltage VDG is positive, the characteristic of the junction capacitance of the third diode DCRR (that is, the characteristic indicated by the characteristic curve A) is chiefly displayed. Moreover, in a region where the drain-gate voltage VDG is negative, the characteristic of the electrostatic capacity of the capacitor COX is chiefly displayed and, in a region where the drain-gate voltage VDG is almost 0 (zero) V, the junction capacitance characteristic of the third diode DCRR and the electrostatic capacitance characteristic of the capacitor COX are displayed at an equal ratio (that is, at a 50% to 50% ratio). Furthermore, the characteristic curve showing the same feedback capacitance Crss as that shown in FIG. 4 can be also obtained even when the drain-gate voltage VDG is changed from 10 V to −10 V at the rate of 1 V/ns.

Thus, according to the first embodiment of the present invention, since the ratio at which the junction capacitance characteristic of the third diode DCRR and the electrostatic capacity characteristic of the capacitor COX are displayed changes in response to the change in the drain-gate voltage VDG and since the junction capacitance characteristic of the third diode DCRR and the electrostatic capacity characteristic of the capacitor COX are displayed at the equal ratio in the region where the drain-gate VDG is almost 0 (zero) V, it is possible to do normal simulation testing and, unlike in the case of the conventional simulation circuit and simulation testing, no oscillation occurs. Moreover, since no resistor component is connected in series in the third diode DCRR and the capacitor COX, there is no time constant. Therefore, the normal characteristic curve C can be normally obtained irrespective of the change rate of the drain-gate voltage VDG.

Second Embodiment

Figure 5:
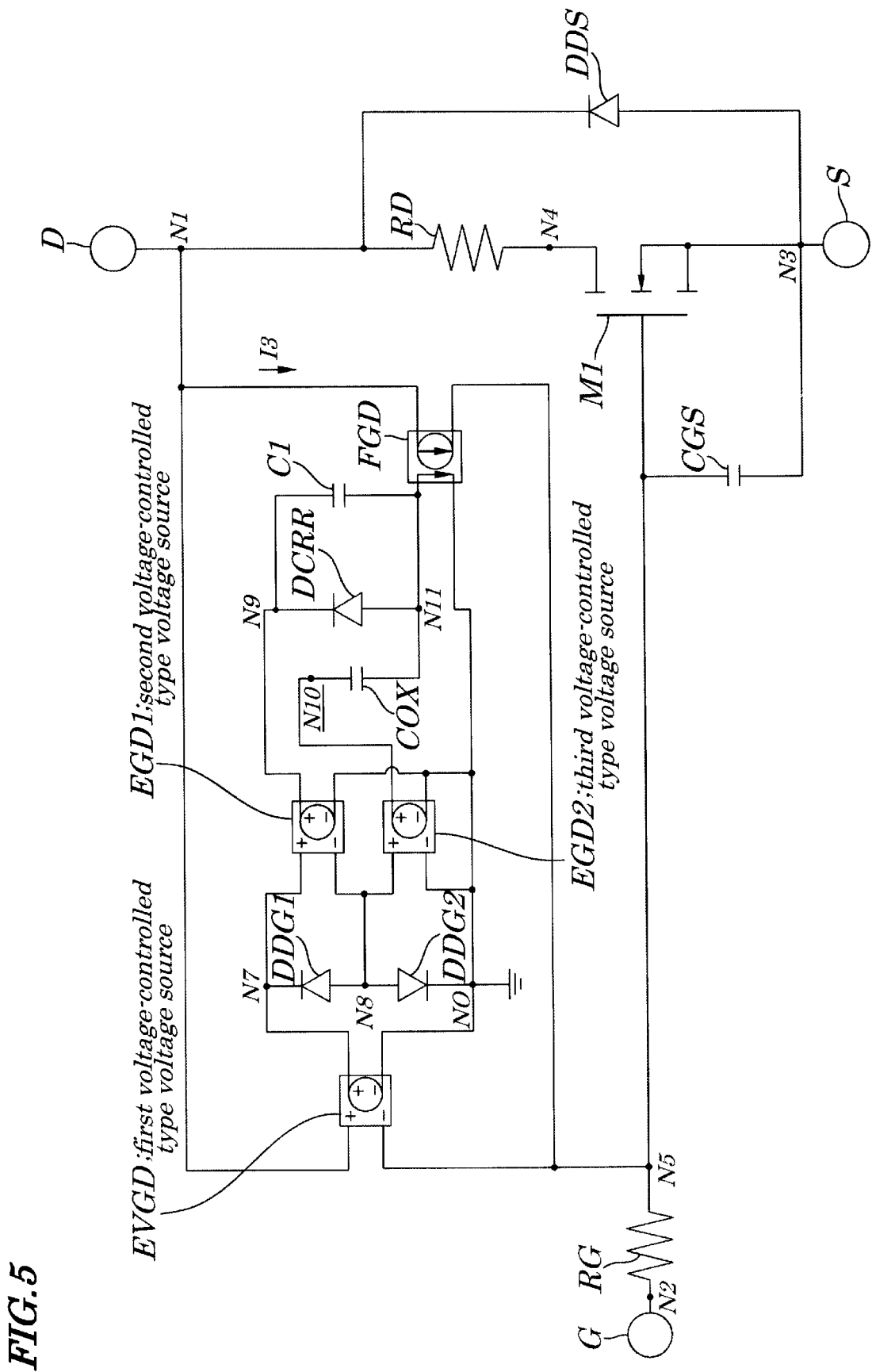
FIG. 5 is a circuit diagram showing electrical configurations of a simulation circuit for MOS transistors according to a second embodiment of the present invention.

FIG. 5 is a circuit diagram for showing electrical configurations of a simulation circuit for MOS transistors according to a second embodiment of the present invention. In FIG. 5, same reference numbers are assigned to corresponding parts having the same functions as in FIG. 1 in the first embodiment. In the simulation circuit shown in FIG. 5, in addition to the third diode DCRR shown in FIG. 1, a capacity characteristic correcting element (for example, a capacitor) C1 is connected in parallel to the third diode DCRR. The capacitor C1 is used to correct a junction capacitance characteristic of the third diode DCRR in order to obtain a normal characteristic curve C when such the normal characteristic curve C of a feedback capacitance Crss as shown in FIG. 4 can not be obtained only by the junction capacitance of the third diode DCRR (for example, when impurity concentration on a surface of a drain substrate in an NMOS M1 has been at a high level). Other configurations are the same as those shown in FIG. 1.

FIG. 6 is a diagram showing an example of a netlist of the simulation circuit for MOS transistors of FIG. 5.

The netlist is stored in, for example, a storage medium such as a CD-ROM, floppy-disk, or a like and is then provided to customers and/or is distributed via the Internet. The customers acquire the netlist and do detailed simulation testing of the simulation circuit for MOS transistors, based on the acquired netlist, by using the simulator such as SPICE.

The same simulation testing as done in the first embodiment is done using the above simulation circuit of MOS transistors of the second embodiment and the same result as obtained in the first embodiment as shown in FIG. 4 is achieved in the second embodiment.

Thus, the second embodiment has another advantage, in addition to advantages obtained in the first embodiment. That is, even when the normal characteristic curve C cannot be obtained only by the junction capacitance of the third diode DCRR, it is possible to obtain the normal characteristic curve C by the capacitor C1 used to correct the junction capacitance characteristic.

Third Embodiment

Figure 7:
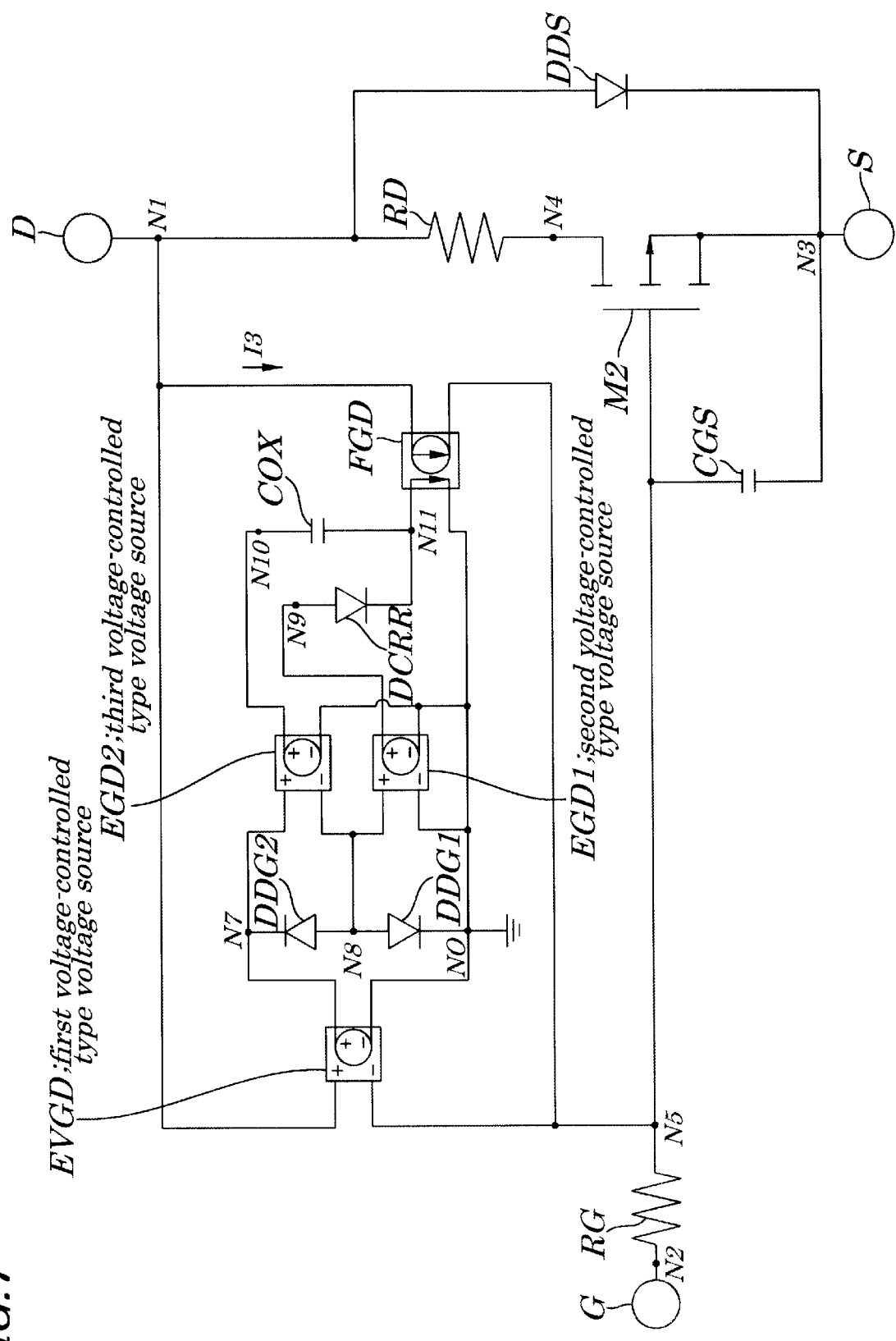
FIG. 7 is a circuit diagram showing electrical configurations of a simulation circuit for MOS transistors according to a third embodiment of the present invention.
Figure 9:
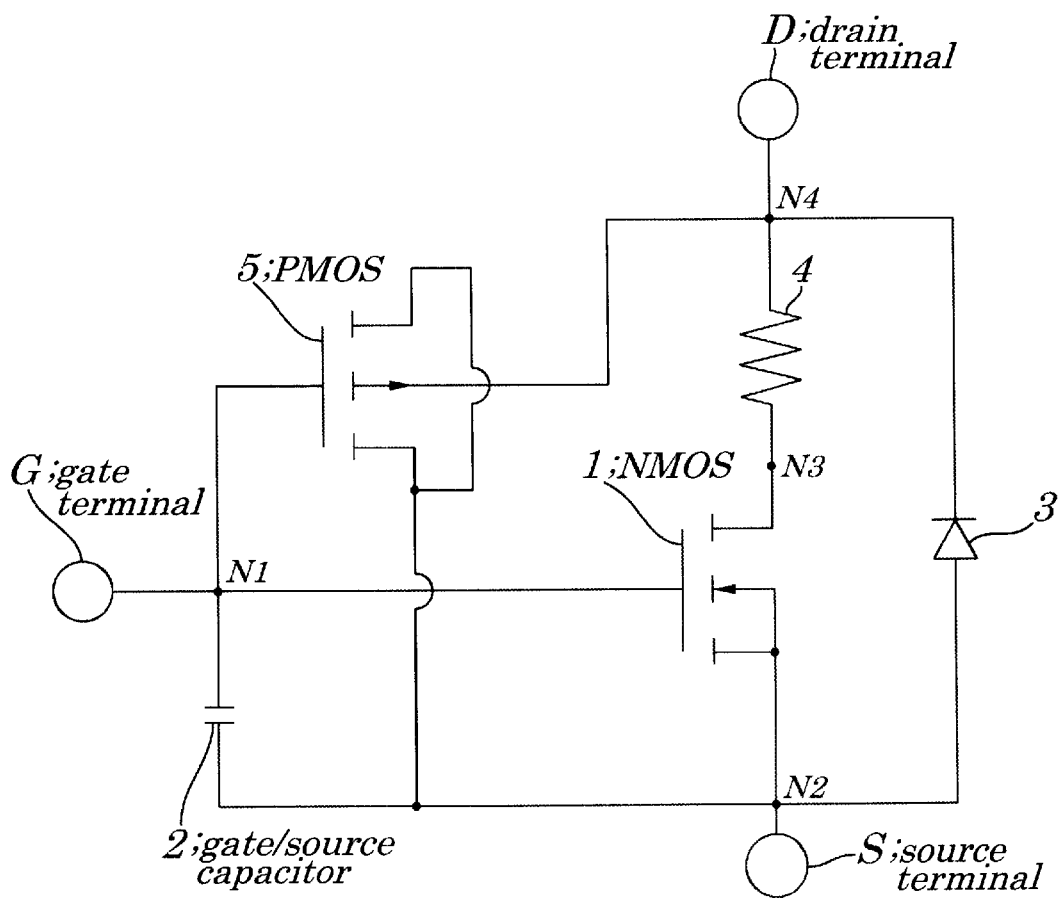
FIG. 9 is a circuit diagram showing electrical configurations of a conventional simulation circuit for MOS transistors.
Figure 10:
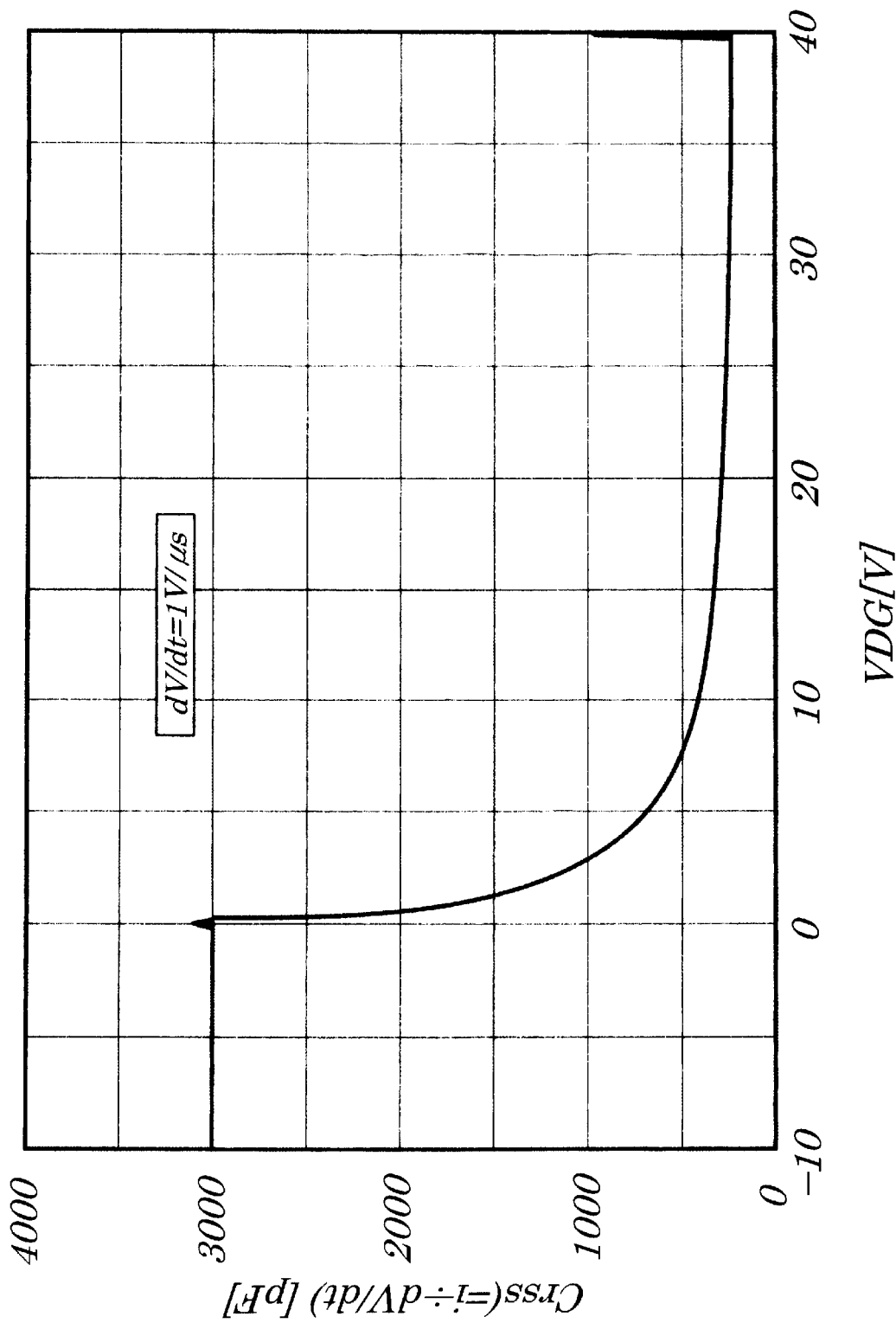
FIG. 10 is a diagram showing a result from simulation testing of the conventional simulation circuit for MOS transistors of FIG. 9.
Figure 11:
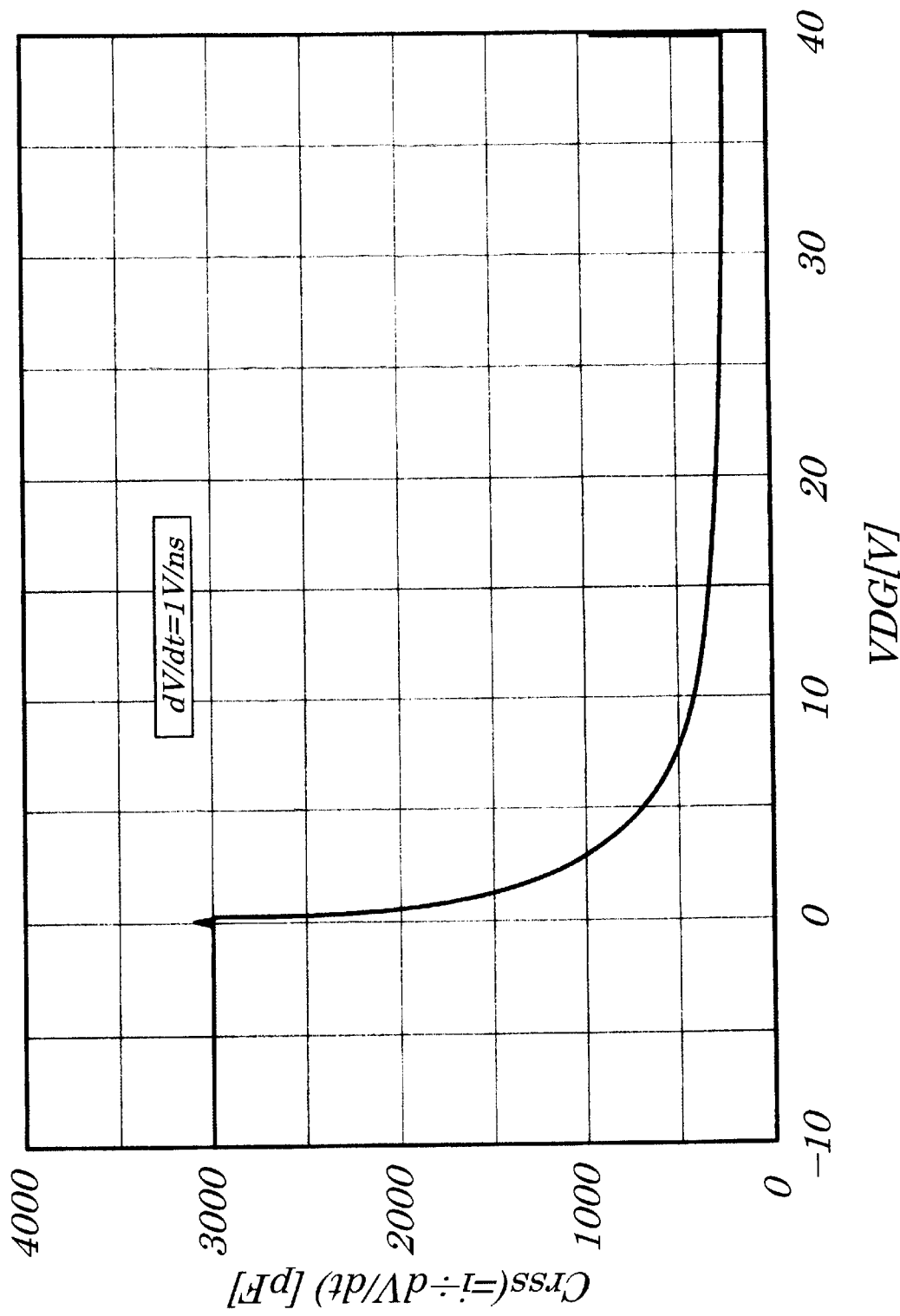
FIG. 11 is also a diagram showing a result from the simulation testing of the conventional simulation circuit for MOS transistors of FIG. 10.
Figure 12:
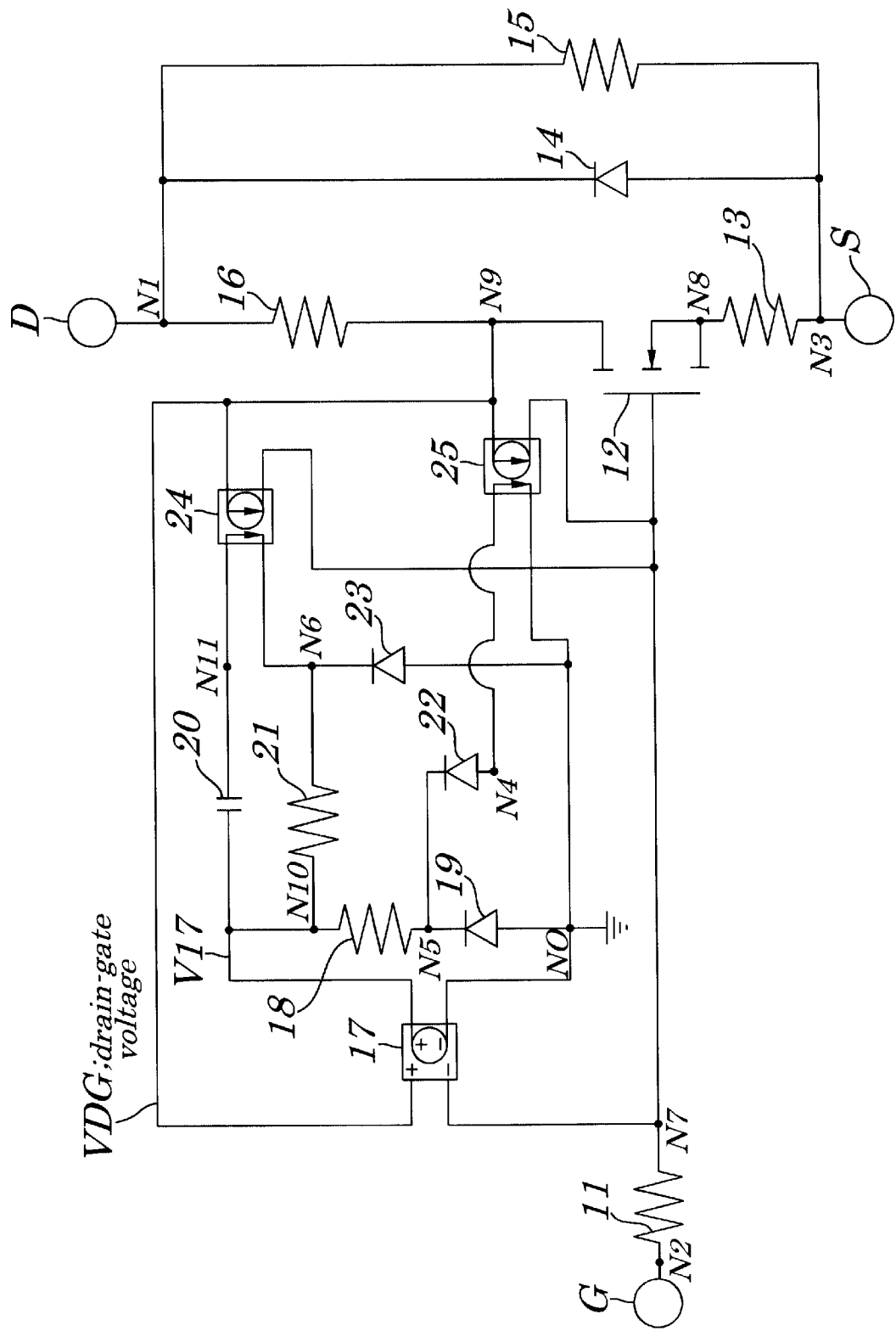
FIG. 12 is a circuit diagram showing electrical configurations of another conventional simulation circuit for MOS transistors.
Figure 13:
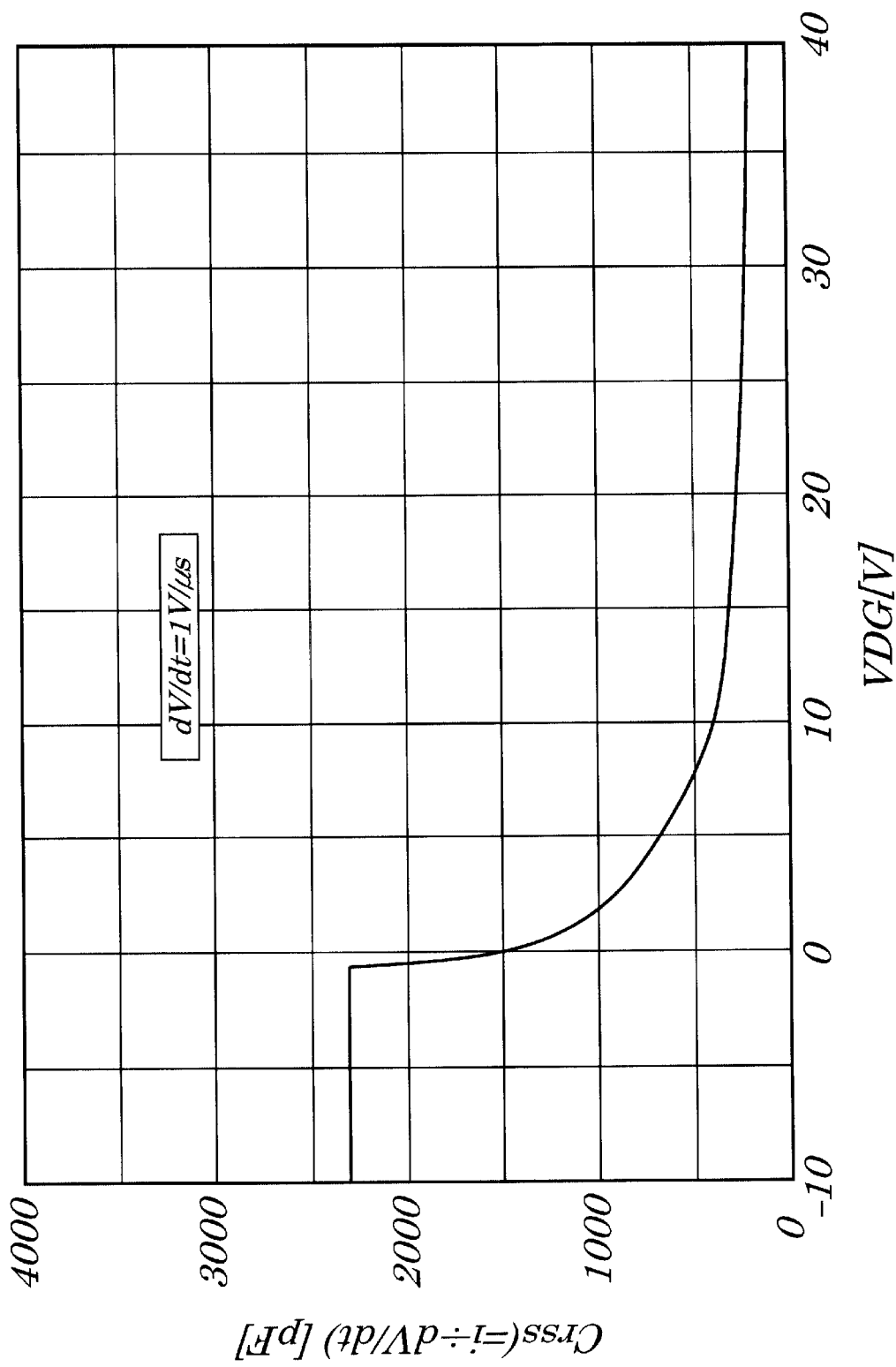
FIG. 13 is a diagram showing a result from simulation testing done using the conventional simulation circuit for MOS transistors of FIG. 12.
Figure 14:
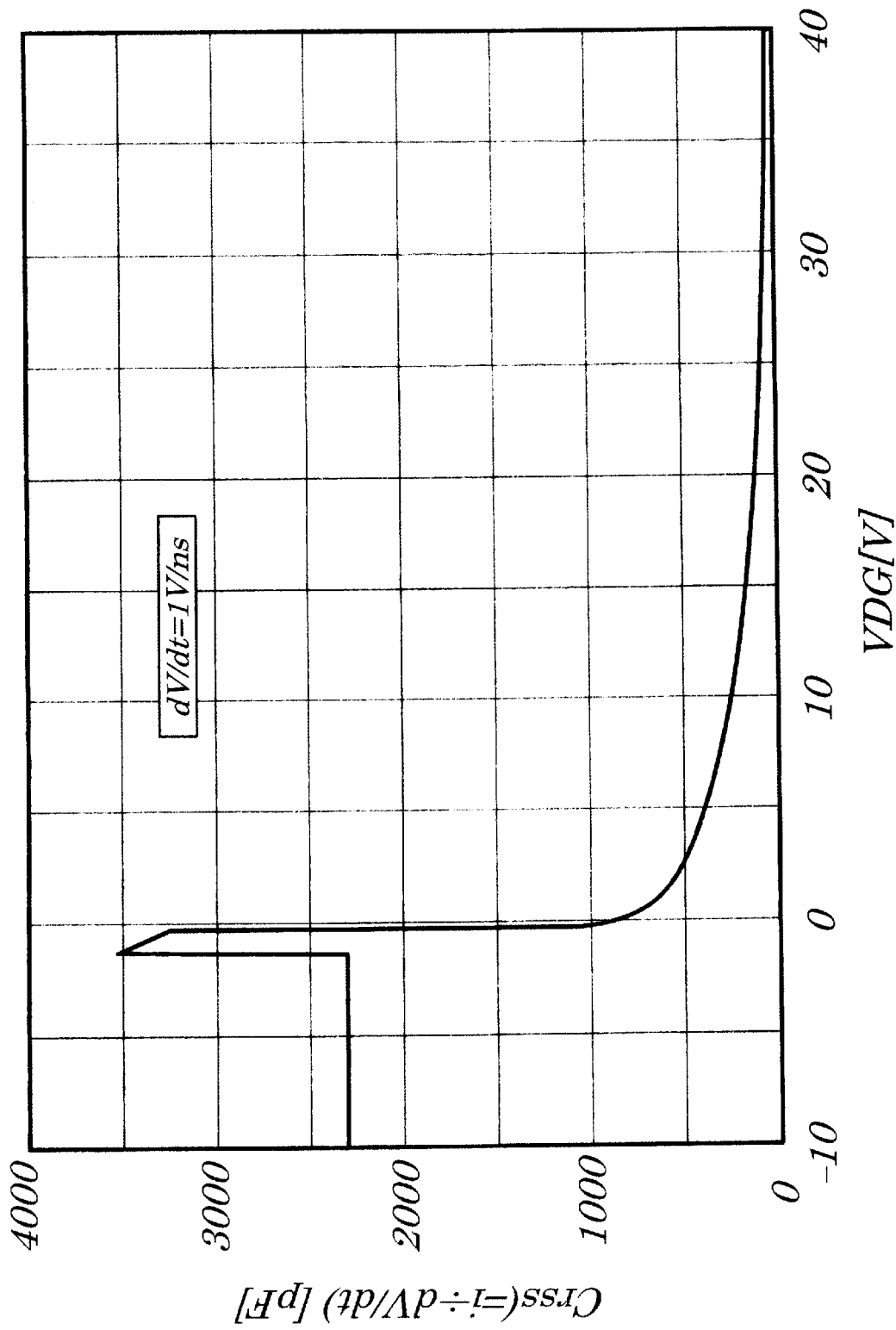
FIG. 14 is also a diagram showing another result from the simulation circuit for MOS transistors of FIG. 12.

FIG. 7 is a circuit diagram for showing electrical configurations of a simulation circuit for MOS transistors according to a third embodiment of the present invention. In FIG. 7, same reference numbers are assigned to corresponding parts having the same functions as in FIG. 1 in the first embodiment.

In the simulation circuit for MOS transistors in FIG. 7, instead of an NMOS M1 shown in FIG. 1, an enhancement-type PMOS M2 is incorporated. Moreover, to a node N3 is connected a cathode of a diode DDS and to a node N1 is connected an anode of the diode DDS. To a node N7 is connected a cathode of a second diode DDG 2 and to a node N8 is connected an anode of the second diode DDG 2. To the node N8 is connected an anode of a first diode DDG 1 and to a node N0 is connected to a cathode of the first diode DDG 1. To the node N7 is connected a plus input terminal of a third voltage-controlled type voltage source EGD 2 and to the node N8 is connected a minus input terminal of the third voltage-controlled type voltage source EGD 2. To the node N8 is connected a plus input terminal of a second voltage-controlled type voltage source EGD 1 and to the node N0 is connected a minus input terminal of the voltage-controlled type voltage source EGD 1. To a node N9 is connected a plus output terminal of the voltage-controlled type voltage source EGD 1 and to the node N9 is connected an anode of a third diode DCRR. A cathode of the third diode DCRR is connected to a node N11. Other configurations in FIG. 7 are the same as those in FIG. 1.

FIG. 8 is a diagram showing an example of a netlist of the simulation circuit for MOS transistors of FIG. 7. The netlist is stored in, for example, a storage medium such as the CD-ROM, floppy-disk, or a like and is then provided to customers and/or is distributed via the Internet. The customers acquire the netlist and do detailed simulation testing of the simulation circuit for MOS transistors, based on the acquired netlist, by using the simulator such as SPICE.

The same simulation testing as done in the first embodiment is done using the above simulation circuit of MOS transistors of the third embodiment and the same result as obtained in the first embodiment as shown in FIG. 4 is achieved in the third embodiment.

Thus, in the third embodiment, even when the PNOS M2 is incorporated instead of the NMOS M1 in the first embodiment, the same advantage as obtained in the first embodiment can be achieved.

It is apparent that the present invention is not limited to the above embodiments but may be changed and modified without departing from the scope and spirit of the invention. For example, the NMOS M1 shown in FIGS. 1 and 5 and the PMOS M2 shown in FIG. 7 are of the enhancement type, however, a depletion-type MOS may be employed. Moreover, instead of the capacitor C1 in FIG. 5, a diode having a predetermined characteristic of the junction capacitance maybe incorporated. The directions of the first diode DDG 1 and the second diode DDG 2 employed in each of the above embodiments may be opposite. In this case, however, connecting positions of the capacitor COX and the third diode DCRR also have to be reversed.

What is claimed is:

1. A simulation circuit for a MOS (Metal Oxide Semiconductor) transistor for doing simulation testing of said MOS transistor using a netlist showing internal configurations of said MOS transistor, said simulation circuit comprising:

a feedback capacitor formed between a gate electrode and a drain electrode of said MOS transistor; and wherein said feedback capacitor includes a diode having a predetermined junction capacitance characteristic and a diode having a predetermined electrostatic capacity characteristic and wherein said junction capacitance characteristic of said diode is chiefly displayed when an absolute value of a voltage of said drain electrode is larger than an absolute value of a voltage of said gate electrode and said electrostatic capacity characteristic of said capacitor is chiefly displayed when said absolute value of a voltage of said drain electrode is smaller than said absolute value of a voltage of said gate electrode and said junction capacitance characteristic of said diode and said electrostatic capacity characteristic of said capacitor are equally displayed when said absolute value of said voltage of said gate electrode is almost same as said absolute value of said voltage of said drain electrode.

2. A simulation circuit for a MOS transistor for doing simulation testing of said MOS transistor using a netlist showing internal configurations of said MOS transistor, said simulation circuit comprising:

a feedback capacitor formed between a gate electrode and a drain electrode of said MOS transistor; and wherein said feedback capacitor includes:

a first voltage-controlled type voltage source, whose terminals on an input side are insulated from terminals on an output side, receives an input of a drain-gate voltage being a voltage between said gate electrode and said drain electrode and outputs a first output voltage having the same value as said drain-gate voltage;

a bidirectional diode having a first diode and a second diode, both of which have no junction capacitance and are connected in series so that said first diode and said second diode are opposite in polarity, wherein said bidirectional diode receives an input of said first output voltage and, when said first output voltage is positive, outputs a second output voltage having almost the same value as said first output voltage from said first diode and, when said first output voltage is negative, outputs a third output voltage having almost the same value as said first output voltage from said second diode and, when said first output voltage is almost 0 (zero) volts, outputs said second output voltage and said third output voltage each being half said first output voltage from said first diode and said second diode respectively;

a second voltage-controlled type voltage source, whose terminals on an input side are insulated from terminals on an output side, receives an input of said second output voltage and outputs a fourth output voltage having the same value as said second output voltage;

a third voltage-controlled type power source, whose terminals on an input side are insulated from terminals on an output side, receives an input of said third output voltage and outputs a fifth output voltage having the same value as said third output voltage;

a third diode having a predetermined junction capacitance characteristic receives an input of said fourth output voltage and outputs a first output current corresponding to said fourth output voltage;

a capacitor having a predetermined electrostatic capacity characteristic receives an input of said fifth output voltage and outputs a second output current corresponding to said fifth output voltage; and a current-controlled type current source, whose terminals on an input side are insulated from terminals on an output side, receives inputs of said first output current and said second output current and causes a third current having the same value as said first output current and said second output current to flow between said gate electrode and said drain electrode.

3. A simulation circuit for a MOS transistor for doing simulation testing of said MOS transistor using a netlist showing internal configurations of said MOS transistor, said simulation circuit comprising:

a feedback capacitor formed between a gate electrode and a drain electrode of said MOS transistor; and wherein said feedback capacitor includes:

a first voltage-controlled type voltage source, whose terminals on an input side are insulated from terminals on an output side, receives an input of a drain-gate voltage being a voltage between said gate electrode and said drain electrode and outputs a first output voltage having the same value as said drain-gate voltage;

a bidirectional diode having a first diode and a second diode, both of which have no junction capacitance and are connected in series so that said first diode and said second diode are opposite in polarity, wherein said bidirectional diode receives an input of said first output voltage and, when said first output voltage is positive, outputs a second output voltage having almost the same value as said first output voltage from said first diode and, when said first output voltage is negative, outputs a third output voltage having almost the same value as said first output voltage from said second diode and, when said first output voltage is almost 0 (zero) volts, outputs said second output voltage and said third output voltage each being half said first output voltage from said first diode and said second diode respectively;

a second voltage-controlled type voltage source, whose terminals on an input side are insulated from terminals on an output side, receives an input of said second output voltage and outputs a fourth output voltage having the same value as said second output voltage;

a third voltage-controlled type power source, whose terminals on an input side are insulated from terminals on an output side, receives an input of said third output voltage and outputs a fifth output voltage having the same value as said third output voltage;

a third diode having a predetermined junction capacitance characteristic receives an input of said fourth output voltage and outputs a first output current corresponding to said fourth output voltage;

a capacity characteristic correcting element being connected in parallel to said third diode and being used to correct said junction capacitance characteristic of said third diode so as to provide a desired junction capacitance characteristic;

a capacitor having a predetermined electrostatic capacity characteristic receives an input of said fifth output voltage and outputs a second output current corresponding to said fifth output voltage; and a current-controlled type current source, whose terminals on an input side are insulated from terminals on an output side, receives inputs of said first output current and said second output current and causes a third current having the same value as said first output current and said second output current to flow between said gate electrode and said drain electrode.

4. The simulation circuit for said MOS transistor according to claim 3, wherein said capacity characteristic correcting element is made up of a capacitor having a predetermined electrostatic capacity characteristic or a diode having a predetermined junction capacitance characteristic.

5. A method for simulation testing of a MOS transistor in which a feedback capacitor is formed between a gate electrode and a drain electrode by using a simulation circuit of said MOS transistor and by using a netlist showing configurations of said MOS transistor, said method comprising:

a step of configuring said feedback capacitor in said simulation circuit using a first voltage-controlled type voltage source, whose terminals on an input side are insulated from terminals on an output side, which receives an input of a drain-gate voltage being a voltage between said gate electrode and said drain electrode and outputs a first output voltage having the same value as said drain-gate voltage;

a step of configuring said feedback capacitor in said simulation circuit using a bidirectional diode having a first diode and a second diode, both of which have no junction capacitance and are connected in series so that said first diode and said second diode are opposite in polarity, wherein said bidirectional diode receives an input of said first output voltage and, when said first output voltage is positive, outputs a second output voltage having almost the same value as said first output voltage from said first diode and, when said first output voltage is negative, outputs a third output voltage having almost the same value as said first output voltage from said second diode and, when said first output voltage is almost 0 (zero) volts, outputs said second output voltage and said third output voltage each being half said first output voltage from said first diode and said second diode respectively;

a step of configuring said feedback capacitor in said simulation circuit using a second voltage-controlled type voltage source, whose terminals on an input side are insulated from terminals on an output side, which receives an input of said second output voltage and outputs a fourth output voltage having the same value as said second output voltage;

a step of configuring said feedback capacitor in said simulation circuit using a third voltage-controlled type power source, whose terminals on an input side are insulated from terminals on an output side, which receives an input of said third output voltage and outputs a fifth output voltage having the same value as said third output voltage;

a step of configuring said feedback capacitor in said simulation circuit using a third diode having a predetermined junction capacitance characteristic which receives an input of said fourth output voltage and outputs a first output current corresponding to said fourth output voltage;

a step of configuring said feedback capacitor in said simulation circuit using a capacitor having a predetermined electrostatic capacity characteristic which receives an input of said fifth output voltage and outputs a second output current corresponding to said fifth output voltage;

a step of configuring said feedback capacitor in said simulation circuit using a current-controlled type current source, whose terminals on an input side are insulated from terminals on an output side, which receives inputs of said first output current and said second output current and causes a third current having the same value as said first output current and said second output current to flow between said gate electrode and said drain electrode; and wherein a value of said feedback capacitor is calculated based on said third output current.

6. A method for simulation testing of a MOS transistor in which a feedback capacitor is formed between a gate electrode and a drain electrode by using a simulation circuit of said MOS transistor and by using a netlist showing configurations of said MOS transistor, said method comprising:

a step of configuring said feedback capacitor in said simulation circuit using a first voltage-controlled type voltage source, whose terminals on an input side are insulated from terminals on an output side, which receives an input of a drain-gate voltage being a voltage between said gate electrode and said drain electrode and outputs a first output voltage having the same value as said drain-gate voltage;

a step of configuring said feedback capacitor in said simulation circuit using a bidirectional diode having a first diode and a second diode, both of which have no junction capacitance and are connected in series so that said first diode and said second diode are opposite in polarity, wherein said bidirectional diode receives an input of said first output voltage and, when said first output voltage is positive, outputs a second output voltage having almost the same value as said first output voltage from said first diode and, when said first output voltage is negative, outputs a third output voltage having almost the same value as said first output voltage from said second diode and, when said first output voltage is almost 0 (zero) volts, outputs said second output voltage and said third output voltage each being half said first output voltage from said first diode and said second diode respectively;

a step of configuring said feedback capacitor in said simulation circuit using a second voltage-controlled type voltage source, whose terminals on an input side are insulated from terminals on an output side, which receives an input of said second output voltage and outputs a fourth output voltage having the same value as said second output voltage;

a step of configuring said feedback capacitor in said simulation circuit using a third voltage-controlled type power source, whose terminals on an input side are insulated from terminals on an output side, which receives an input of said third output voltage and outputs a fifth output voltage having the same value as said third output voltage;

a step of configuring said feedback capacitor in said simulation circuit using a third diode having a predetermined junction capacitance characteristic which receives an input of said fourth output voltage and outputs a first output current corresponding to said fourth output voltage;

a step of configuring said feedback capacitor in said simulation circuit using a capacity characteristic correcting element which is connected in parallel to said third diode and is used to correct said junction capacitance characteristic of said third diode so as to provide a desired junction capacitance characteristic;

a step of configuring said feedback capacitor in said simulation circuit using a capacitor having a predetermined electrostatic capacity characteristic which receives an input of said fifth output voltage and outputs a second output current corresponding to said fifth output voltage; and a step of configuring said feedback capacitor in said simulation circuit using a current-controlled type current source, whose terminals on an input side are insulated from terminals on an output side, which receives inputs of said first output current and said second output current and causes a third current having the same value as said first output current and said second output current to flow between said gate electrode and said drain electrode; and wherein a value of said feedback capacitor is calculated based on said third output current.

7. A storage medium storing a netlist to implement a simulation circuit of MOS (Metal Oxide Semiconductor) transistors on a computer, said simulation circuit comprising:

a feedback capacitor formed between a gate electrode and a drain electrode of said MOS transistor; and wherein said feedback capacitor includes a diode having a predetermined junction capacitance characteristic and a diode having a predetermined electrostatic capacity characteristic and wherein said junction capacitance characteristic of said diode is chiefly displayed when an absolute value of a voltage of said drain electrode is larger than an absolute value of a voltage of said gate electrode and said electrostatic capacity characteristic of said capacitor is chiefly displayed when said absolute value of a voltage of said drain electrode is smaller than said absolute value of a voltage of said gate electrode and said junction capacitance characteristic of said diode and said electrostatic capacity characteristic of said capacitor are equally displayed when said absolute value of said voltage of said gate electrode is almost same as said absolute value of said voltage of said drain electrode, hereby doing simulation testing of said MOS transistor using a netlist showing internal configurations of said MOS transistor.

8. A storage medium storing a netlist to implement a simulation circuit of MOS (Metal Oxide Semiconductor) transistors on a computer, said simulation circuit comprising:

a feedback capacitor formed between a gate electrode and a drain electrode of said MOS transistor; and wherein said feedback capacitor includes:

a first voltage-controlled type voltage source, whose terminals on an input side are insulated from terminals on an output side, receives an input of a drain-gate voltage being a voltage between said gate electrode and said drain electrode and outputs a first output voltage having the same value as said drain-gate voltage;

a bidirectional diode having a first diode and a second diode, both of which have no junction capacitance and are connected in series so that said first diode and said second diode are opposite in polarity, wherein said bidirectional diode receives an input of said first output voltage and, when said first output voltage is positive, outputs a second output voltage having almost the same value as said first output voltage from said first diode and, when said first output voltage is negative, outputs a third output voltage having almost the same value as said first output voltage from said second diode and, when said first output voltage is almost 0 (zero) volts, outputs said second output voltage and said third output voltage each being half said first output voltage from said first diode and said second diode respectively;

a second voltage-controlled type voltage source, whose terminals on an input side are insulated from terminals on an output side, receives an input of said second output voltage and outputs a fourth output voltage having the same value as said second output voltage;

a third voltage-controlled type power source, whose terminals on an input side are insulated from terminals on an output side, receives an input of said third output voltage and outputs a fifth output voltage having the same value as said third output voltage;

a third diode having a predetermined junction capacitance characteristic receives an input of said fourth output voltage and outputs a first output current corresponding to said fourth output voltage;

a capacitor having a predetermined electrostatic capacity characteristic receives an input of said fifth output voltage and outputs a second output current corresponding to said fifth output voltage; and a current-controlled type current source, whose terminals on an input side are insulated from terminals on an output side, receives inputs of said first output current and said second output current and causes a third current having the same value as said first output current and said second output current to flow between said gate electrode and said drain electrode, hereby doing simulation testing of said MOS transistor using a netlist showing internal configurations of said MOS transistor.

9. A storage medium storing a netlist to implement a simulation circuit of MOS (Metal Oxide Semiconductor) transistors on a computer, said simulation circuit comprising:

a feedback capacitor formed between a gate electrode and a drain electrode of said MOS transistor; and wherein said feedback capacitor includes:

a first voltage-controlled type voltage source, whose terminals on an input side are insulated from terminals on an output side, receives an input of a drain-gate voltage being a voltage between said gate electrode and said drain electrode and outputs a first output voltage having the same value as said drain-gate voltage;

a bidirectional diode having a first diode and a second diode, both of which have no junction capacitance and are connected in series so that said first diode and said second diode are opposite in polarity, wherein said bidirectional diode receives an input of said first output voltage and, when said first output voltage is positive, outputs a second output voltage having almost the same value as said first output voltage from said first diode and, when said first output voltage is negative, outputs a third output voltage having almost the same value as said first output voltage from said second diode and, when said first output voltage is almost 0 (zero) volts, outputs said second output voltage and said third output voltage each being half said first output voltage from said first diode and said second diode respectively;

a second voltage-controlled type voltage source, whose terminals on an input side are insulated from terminals on an output side, receives an input of said second output voltage and outputs a fourth output voltage having the same value as said second output voltage;

a third voltage-controlled type power source, whose terminals on an input side are insulated from terminals on an output side, receives an input of said third output voltage and outputs a fifth output voltage having the same value as said third output voltage;

a third diode having a predetermined junction capacitance characteristic receives an input of said fourth output voltage and outputs a first output current corresponding to said fourth output voltage;

a capacity characteristic correcting element being connected in parallel to said third diode and being used to correct said junction capacitance characteristic of said third diode so as to provide a desired junction capacitance characteristic;

a capacitor having a predetermined electrostatic capacity characteristic receives an input of said fifth output voltage and outputs a second output current corresponding to said fifth output voltage; and a current-controlled type current source, whose terminals on an input side are insulated from terminals on an output side, receives inputs of said first output current and said second output current and causes a third current having the same value as said first output current and said second output current to flow between said gate electrode and said drain electrode;

hereby doing simulation testing of said MOS transistor using a netlist showing internal configurations of said MOS transistor.

10. A netlist for showing internal configurations of MOS transistor (Metal Oxide Semiconductor) and for implementing a simulation circuit of said MOS transistors on a computer, said simulation circuit comprising:

a feedback capacitor formed between a gate electrode and a drain electrode of said MOS transistor; and wherein said feedback capacitor includes a diode having a predetermined junction capacitance characteristic and a diode having a predetermined electrostatic capacity characteristic and wherein said junction capacitance characteristic of said diode is chiefly displayed when an absolute value of a voltage of said drain electrode is larger than an absolute value of a voltage of said gate electrode and said electrostatic capacity characteristic of said capacitor is chiefly displayed when said absolute value of a voltage of said drain electrode is smaller than said absolute value of a voltage of said gate electrode and said junction capacitance characteristic of said diode and said electrostatic capacity characteristic of said capacitor are equally displayed when said absolute value of said voltage of said gate electrode is almost same as said absolute value of said voltage of said drain electrode, hereby doing simulation testing of said MOS transistor.

11. A netlist for showing internal configurations of MOS transistor (Metal Oxide Semiconductor) and for implementing a simulation circuit of said MOS transistors on a computer, said simulation circuit comprising:

a feedback capacitor formed between a gate electrode and a drain electrode of said MOS transistor; and wherein said feedback capacitor includes:

a first voltage-controlled type voltage source, whose terminals on an input side are insulated from terminals on an output side, receives an input of a drain-gate voltage being a voltage between said gate electrode and said drain electrode and outputs a first output voltage having the same value as said drain-gate voltage;

a bidirectional diode having a first diode and a second diode, both of which have no junction capacitance and are connected in series so that said first diode and said second diode are opposite in polarity, wherein said bidirectional diode receives an input of said first output voltage and, when said first output voltage is positive, outputs a second output voltage having almost the same value as said first output voltage from said first diode and, when said first output voltage is negative, outputs a third output voltage having almost the same value as said first output voltage from said second diode and, when said first output voltage is almost 0 (zero) volts, outputs said second output voltage and said third output voltage each being half said first output voltage from said first diode and said second diode respectively;

a second voltage-controlled type voltage source, whose terminals on an input side are insulated from terminals on an output side, receives an input of said second output voltage and outputs a fourth output voltage having the same value as said second output voltage;

a third voltage-controlled type power source, whose terminals on an input side are insulated from terminals on an output side, receives an input of said third output voltage and outputs a fifth output voltage having the same value as said third output voltage;

a third diode having a predetermined junction capacitance characteristic receives an input of said fourth output voltage and outputs a first output current corresponding to said fourth output voltage;

a capacitor having a predetermined electrostatic capacity characteristic receives an input of said fifth output voltage and outputs a second output current corresponding to said fifth output voltage; and a current-controlled type current source, whose terminals on an input side are insulated from terminals on an output side, receives inputs of said first output current and said second output current and causes a third current having the same value as said first output current and said second output current to flow between said gate electrode and said drain electrode, hereby doing simulation testing of said MOS transistor.

12. A netlist for showing internal configurations of MOS transistor (Metal Oxide Semiconductor) and for implementing a simulation circuit of said MOS transistors on a computer, said simulation circuit comprising:

a feedback capacitor formed between a gate electrode and a drain electrode of said MOS transistor; and wherein said feedback capacitor includes:

a first voltage-controlled type voltage source, whose terminals on an input side are insulated from terminals on an output side, receives an input of a drain-gate voltage being a voltage between said gate electrode and said drain electrode and outputs a first output voltage having the same value as said drain-gate voltage;

a bidirectional diode having a first diode and a second diode, both of which have no junction capacitance and are connected in series so that said first diode and said second diode are opposite in polarity, wherein said bidirectional diode receives an input of said first output voltage and, when said first output voltage is positive, outputs a second output voltage having almost the same value as said first output voltage from said first diode and, when said first output voltage is negative, outputs a third output voltage having almost the same value as said first output voltage from said second diode and, when said first output voltage is almost 0 (zero) volts, outputs said second output voltage and said third output voltage each being half said first output voltage from said first diode and said second diode respectively;

a second voltage-controlled type voltage source, whose terminals on an input side are insulated from terminals on an output side, receives an input of said second output voltage and outputs a fourth output voltage having the same value as said second output voltage;

a third voltage-controlled type power source, whose terminals on an input side are insulated from terminals on an output side, receives an input of said third output voltage and outputs a fifth output voltage having the same value as said third output voltage;

a third diode having a predetermined junction capacitance characteristic receives an input of said fourth output voltage and outputs a first output current corresponding to said fourth output voltage;

a capacity characteristic correcting element being connected in parallel to said third diode and being used to correct said junction capacitance characteristic of said third diode so as to provide a desired junction capacitance characteristic;

a capacitor having a predetermined electrostatic capacity characteristic receives an input of said fifth output voltage and outputs a second output current corresponding to said fifth output voltage; and a current-controlled type current source, whose terminals on an input side are insulated from terminals on an output side, receives inputs of said first output current and said second output current and causes a third current having the same value as said first output current and said second output current to flow between said gate electrode and said drain electrode;

hereby doing simulation testing of said MOS transistor.

\* \* \* \* \*